(12) United States Patent
Watanabe

(10) Patent No.: US 6,667,211 B2
(45) Date of Patent: Dec. 23, 2003

(54) NON-VOLATILE SEMICONDUCTOR MEMORY DEVICE AND METHOD OF MANUFACTURING THE SAME

(75) Inventor: Toshiharu Watanabe, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/292,265

(22) Filed: Nov. 12, 2002

(65) Prior Publication Data

US 2003/0082879 A1 May 1, 2003

Related U.S. Application Data

(62) Division of application No. 09/088,460, filed on Jun. 1, 1998, now Pat. No. 6,512,262.

(30) Foreign Application Priority Data

Jun. 6, 1997 (JP) .............................................. 9-149680

(51) Int. Cl.[7] .............................................. H01L 21/336
(52) U.S. Cl. ........................ 438/259; 438/258; 438/589; 438/593
(58) Field of Search ................................ 438/257–259, 438/266, 589, 592, 593

(56) References Cited

U.S. PATENT DOCUMENTS 5,973,356 A * 10/1999 Noble et al. ................. 257/319
6,054,733 A    4/2000 Doan et al. .................. 257/316
6,060,740 A    5/2000 Shimizu et al. ............. 257/316
6,200,856 B1 * 3/2001 Chen .......................... 438/257

FOREIGN PATENT DOCUMENTS

| JP | 62-163376 | 7/1987 |
| JP | 05-029585 | 2/1993 |
| JP | 06-334196 | 12/1994 |
| JP | 08-316348 | 11/1996 |

OTHER PUBLICATIONS

Choi, et al., "A Novel Booster Plate Technology in High Density NAND Flash Memories for Voltage Scaling–Down and Zero Program Disturbance," 1996 Symposium on VLSI Technology Digest of Technical Digest of Technical Papers. pp. 238–239.

* cited by examiner

Primary Examiner—Amir Zarabian
Assistant Examiner—Jamie L. Brophy
(74) Attorney, Agent, or Firm—Hogan & Hartson, LLP

(57) ABSTRACT

A non-volatile semiconductor memory device comprising a device isolation insulation layer, formed on a semiconductor substrate, for defining a device region, a floating gate formed on the device region and having a pair of first side faces opposed to a side face of the device isolation insulation layer, which the side face is located on the device region side, a control gate formed above the floating gate, and a booster electrode having faces opposed to a pair of second surfaces which are substantially perpendicular to the pair of first side faces. A distance between the pair of first side faces of the floating gate is less than a width of the device region defined by the device isolation insulation layer.

8 Claims, 20 Drawing Sheets

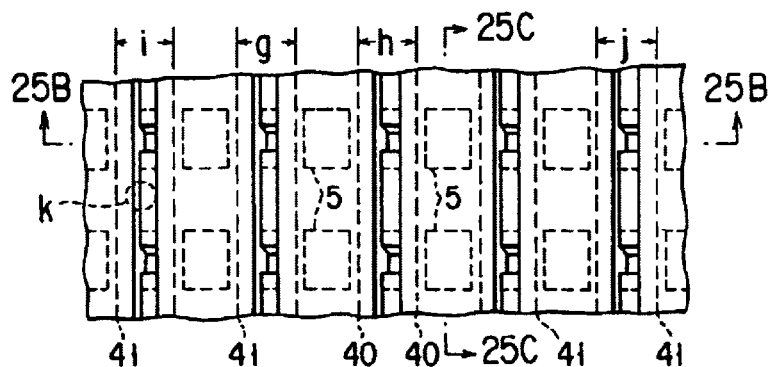
FIG. 25A
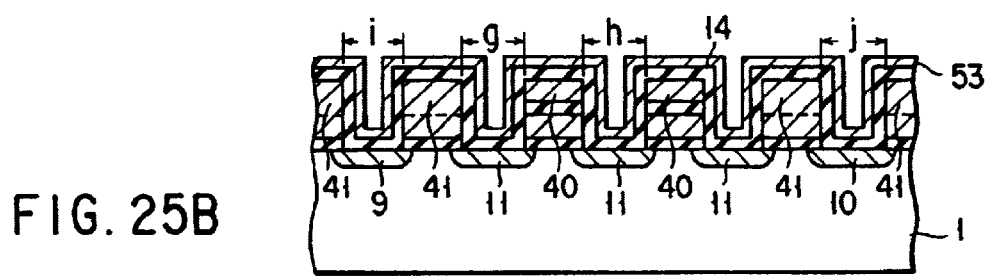
FIG. 25B
FIG. 25C
FIG. 26C
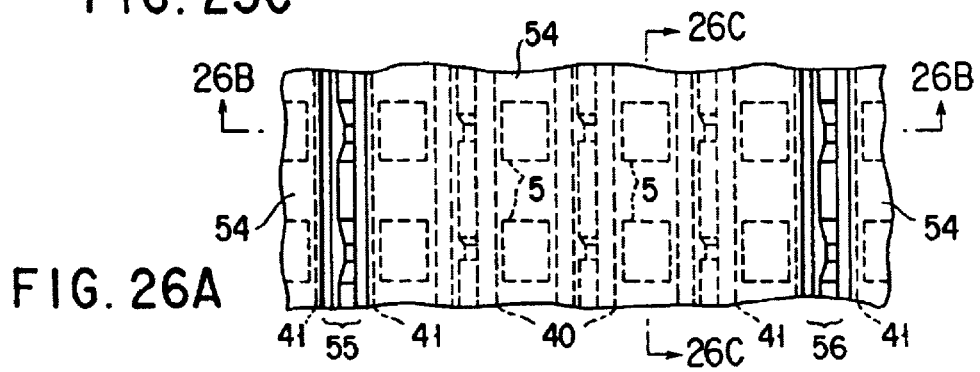
FIG. 26A
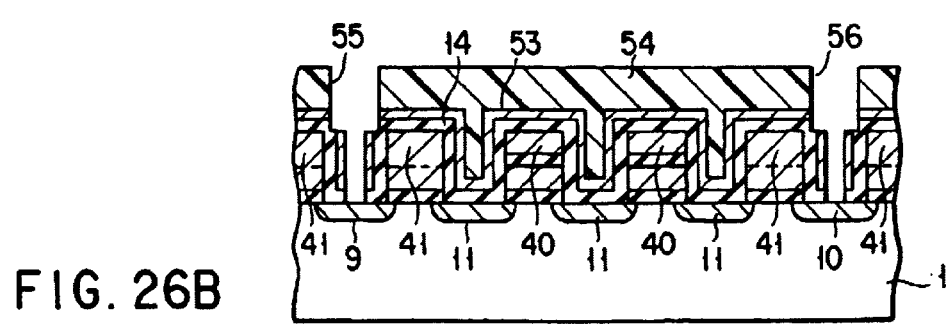
FIG. 26B

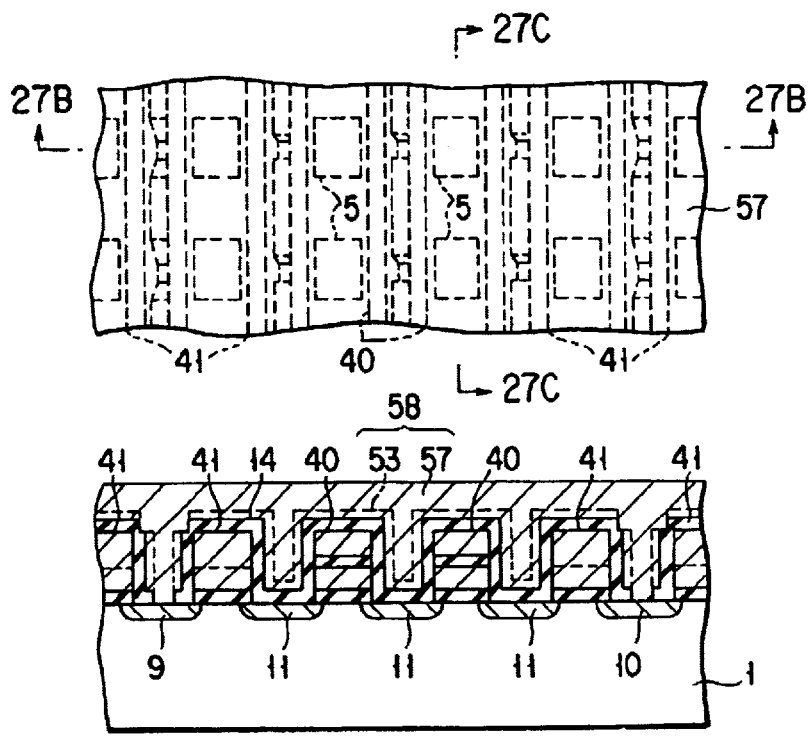
FIG. 27A
FIG. 27B
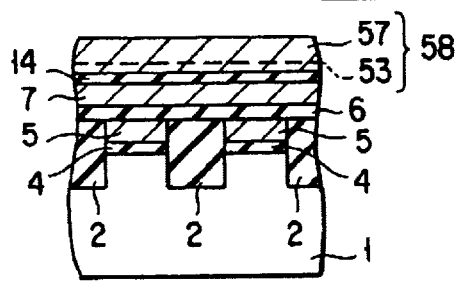
FIG. 27C
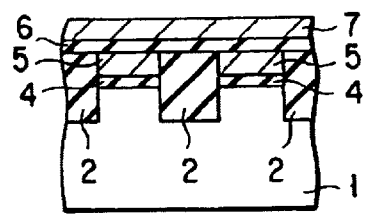
FIG. 28C
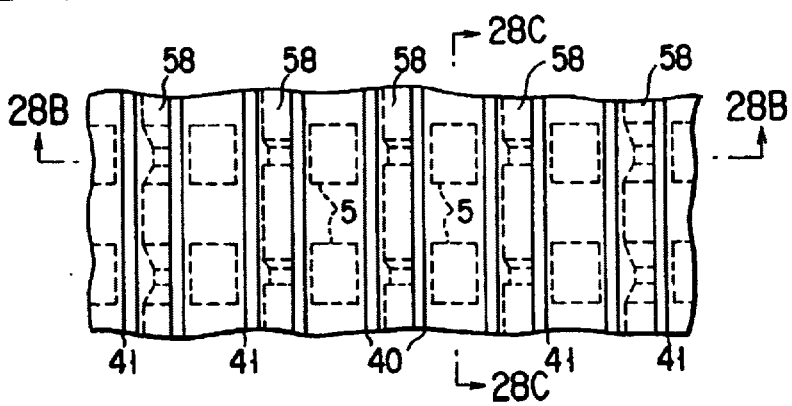
FIG. 28A
FIG. 28B

NON-VOLATILE SEMICONDUCTOR MEMORY DEVICE AND METHOD OF MANUFACTURING THE SAME This is a divisional of application Ser. No. 09/088,460, filed Jun. 1, 1998, which application is hereby incorporated by reference in its entirety.

BACKGROUND OF THE INVENTION

The present invention relates to an electrically programmable non-volatile semiconductor memory device having an electrode called a booster plate.

An EEPROM having an electrode called a booster plate is described, for example, in 1996 Symposium on VLSI Technology Digest of Technical Papers, pp. 238–239 (I. D. Choi, D. J. Kim, D. S. Jang, J. Kim, H. S. Kim, W. C. Shin, S. T. Ahn, and O. H. Kwon, Samsung Electronics Co., LTD.).

In this specification, the electrode called "booster plate" is referred to as "booster electrode." An EEPROM cell having the booster electrode will now be generally described.

FIG. 1A is a plan view of a conventional memory cell, FIG. 1B is a cross-sectional view taken along line B—B in FIG. 1A, and FIG. 1C is a cross-sectional view taken along line C—C in FIG. 1A. For simple description, bit lines and an underlying interlayer insulating film are omitted in FIG. 1A.

As is shown in FIGS. 1A to 1C, device isolation insulation films 102 are formed in a surface portion of a P-type silicon substrate 101. Device regions 103 are defined on a surface of the substrate 101 by the device isolation insulation films 102.

A tunnel insulation film 104, a floating gate 105, an insulation film 106 and a word line 107 are successively formed on the device region 103. A structure wherein the floating gate 105 and word line 107 are stacked is called a stacked-gate structure.

Reference numeral 108 denotes a gate of a select transistor. N-type diffusion layers 109, 110 and 111 are formed in the device region 103. The diffusion layer 109 is connected to a source line (not shown), and the diffusion layer 110 is to a bit line 112. The number of diffusion layers 111 is two or more and these layers 111 function as source/drain regions of memory cell transistors, respectively.

A booster electrode insulating film 114 is formed over the periphery of the stacked-gate structure and the diffusion layers 111. A booster electrode 115 is formed on the insulating film 114. Reference numeral 144 denotes an interlayer insulation film.

FIG. 2A shows an equivalent circuit of the conventional EEPROM. For the purpose of simple description, FIG. 2A shows the case where two word lines (WL1, WL2) and two bit lines (BL1, BL2) are provided.

As is shown in FIG. 2A, a select transistor ST11, cell transistors MC11 and MC21 and a select transistor ST21 are connected in series between a bit line BL1 and a source line SL.

Similarly, a select transistor ST12, cell transistors MC12 and MC22 and a select transistor ST22 are connected in series between a bit line BL2 and the source line SL.

A word line WL1 is commonly connected to the gates of the cell transistors MC11 and MC12, and a word line WL2 is commonly connected to the gates of the cell transistors MC21 and MC22.

A drain-side select gate line SG1 is commonly connected to the gates of the select transistors ST11 and ST12, and a source-side select gate line SG2 is commonly connected to the gates of the select transistors ST21 and ST22. A back-gate (BULK) of each transistor is common.

In the NAND type EEPROM, the potential of the back-gate BULK is varied in accordance with the operation mode. A booster electrode BP is capacitively coupled to the mutual connection nodes and floating gates FG11, FG12, FG21 and FG22 of the respective transistors.

The write operation will now be described on the basis of the disclosure in the above-mentioned document. In the following description, a write operation for injecting electrons into the floating gate is called "0" write, and a write operation for injecting no electrons into the floating gate is called "1" write. FIG. 2B shows potentials of respective nodes in the write mode.

In the NAND type flash EEPROM disclosed in the above-mentioned document, the potential of the selected word line WL1 is set at 13V, the potential of the booster electrode BP is at 13V, the potential of the bit line BL1 designated for "0" write is at 0V, the potential of the drain-side select gate line SG1 is at 3.3V, the potential of the source-side select gate line SG2 is at 0V, and the potential of the non-selected word line WL2 is at 3.3V.

At this time, the potentials of both the write-selected word line WL1 and booster electrode BP are 13V. A potential corresponding to about a coupling ratio (γpgm) "0.78" between the floating gate FG11 and word line WL1 can be produced at the floating gate FG11 by a potential of the booster electrode BP, and a potential of about 10V is applied to the tunnel insulation film.

Accordingly, even if the write potential is 13V, electrons are injected into the floating gate FG11 through the tunnel oxide film having about 10 nm thick. Thus, "0" write is effected in the cell MC11.

On the other hand, the gate potential of the cell MC21 belonging to the same bit line BL1 and having the gate connected to the non-selected word line WL2 is 3.3V, and the potential of the booster electrode BP is 13V. At this time, the voltage of 3.3V applied to the word line WL2 acts to lower the potential of the floating gate FG21. Thus, no electrons are injected in the floating gate FG21.

On the other hand, the potential of the bit line BL2 designated for "1" write is 3.3V. Since the potential of the drain-side select gate line SG1 is 3.3V at this time, the select transistor ST12 is cut off when the potential of "3.3V-VthST" has been transferred to the N-type diffusion layer. As a result, the region 116 of the diffusion layer 111 shown in FIG. 1B and channel 113 of the memory cell (hereinafter referred to as "NAND cell channel 116" or simply "cell channel 116") is set in the floating state.

In this case, "VthST" is a threshold voltage of the select transistor ST12. At this time the potential of the cell channel 116 is raised by the potential of booster electrode BP.

The potential, 13V, of the selected word line WL1 contributes to raising the potential of cell channel 116 through the floating gate FG12. In this manner the potential of cell channel 116 is raised up to about 8V.

In the cell MC12 having the gate connected to the selected word line WL1, a potential difference between the channel thereof and the word line WL1 decreases to "13V−8V=5V" and no electrons are injected in the floating gate FG12.

Thus, data "1" is written in the cell MC12. As described above, in the EEPROM having the booster electrode BP, the potential of the cell channel 116 is greatly raised up to about 8V in the write-selected cell MC12 connected to the bit line BL2 designated for "1" write.

In addition, in the cell MC22 having the gate connected to the non-selected word line WL2, a potential difference between the channel thereof and the word line WL2 is "3.3V−8V=−4.7V" and no electrons are injected in the floating gate FG22.

As has been described above, the main function of the booster electrode BP is to increase the effective coupling ratio γpgm so that the potential of the floating gate is sufficiently raised at the time of "0" write, thereby lowering the potential (write potential VPP) of the selected word line from 17V to 13V.

Furthermore, the channel potential of the cell for "1" write is raised from "3.3-VthST", as in the prior art, to about 8V, thereby making it difficult for electrons to be injected in the floating gate. Thereby, occurrence of "erroneous write", such as erroneous write of "0", can be prevented.

However, in the conventional EEPROM having the booster electrode, the coupling ratio γpgm in write mode varies due to "processing error" at the time of forming the device isolation region 102 and "processing error" at the time of forming the floating gate 105, as will be described below in detail.

FIG. 3 is a bird's eye view showing dimensions of the floating gate.

Suppose, as shown in FIG. 3, that the dimension of the floating gate 105 along the bit line is "a", the dimension of floating gate 105 along the word line is "b", the height of floating gate 105 is "c", and the width of the device region 103 is "d".

In addition, suppose that the thickness of the tunnel insulation film 104 between the substrate 101 and floating gate 105, as shown in FIGS. 1A to 1C, is "tox1", the thickness of the insulation film 106 between the floating gate 105 and word line 107 is "tox2", and the thickness of the booster electrode insulating film 114 between the floating gate 105 and booster electrode 115 is "tox3."

At this time, the capacitance C1 between the substrate 101 and floating gate 105 is given by $$C1=\epsilon 0 \cdot \epsilon r(a \cdot d)/tox1.$$

The capacitance C2 between the floating gate 105 and word line 107 is given by $$C2=\epsilon 0 \cdot \epsilon r(b+2c)a/tox2.$$

The capacitance C3 between the floating gate 105 and booster electrode 115 is given by $$C3=\epsilon 0 \cdot \epsilon r(2b \cdot c)/tox3.$$

When the potential of word line 107 is write potential VPP, the potential VFG of the floating gate 105 is given by the following, if the charge in the floating gate 105 is ignored:

$$(VPP-VFG) \cdot (C2+C3)=VFG \cdot C1$$

Accordingly, $$VFG=(C2+C3) \cdot VPP/(C1+C2+C3)=\gamma pgm \cdot Vpp.$$

As the capacitance C2, C3 increases, the potential VFG becomes closer to the potential VPP and increases. At this time, the width "b" of floating gate 105 along the word line 107 is not included in the capacitance C1 but is included in the capacitance C2, C3.

Accordingly, as the width "b" increases, the capacitance C2, C3 increases and the value of potential VFG also increases. In other words, if the width "b" varies, the value of potential VFG varies.

The variance in potential VFG results in a variance in write charge (quality of electrons injected in the floating gate), and the variance in threshold voltage of the cell in which data "0" has been written increases.

In particular, in these years, data to be stored in the EEPROM has gradually changed from general two-value data to multi-value data. Thus, there is a demand that the threshold voltage of the cell be distributed in a very narrow range.

In order to meet the demand, the quantity of electrons injected in the floating gate needs to be controlled with higher precision. However, the variance in potential VFG makes the control difficult.

In addition, if the value of potential VFG varies, a possibility increases that electrons may be injected in the floating gate of the non-selected cell in which a gate is the word line or the cell for "1" write at the time of data write.

Although the width "d" of the device region 103 is not included in the capacitance C2, C3, it is included in the capacitance C1. The effective coupling ratio γpgm is expressed by $$\gamma pgm=(C2+C3)/(C1+C2+C3)=[\{(b+2c)a/tox2\}+\{(2b \cdot c)/tox3\}]/[\{(a \cdot d)/tox1\}+\{(b+2c)a/tox2\}+\{(2b \cdot c)/tox3\}]$$

Accordingly, if the width "d" of device region 103 varies, the coupling ratio γpgm varies at the time of data write.

FIG. 4 is a graph showing the dependency of the coupling ratio γpgm upon the width "d" of the device region 103. In FIG. 4, the variation of the coupling ratio γpgm is plotted when the width "d" of the device region 103 has varied in the cell having substantially the following values: a=0.25 μm, b=0.45 μm, c=0.1 μm, d=0.25 μm, tox1=10 nm, tox2=14 nm, and tox3=30 nm.

As is shown in FIG. 4, the coupling ratio γpgm decreases as the width "d" of device region 103 increases.

If the coupling ratio γpgm varies, the variation in distribution of threshold voltage of the cell increases. In order to decrease the variance of distribution of threshold voltage, it is possible, for example, to divide the write pulse into small components and inject electrons into the floating gate little by little. In this case, however, the write time increases.

Furthermore, if there is a cell wherein electrons may be easily injected due to variance in coupling ratio γpgm, defects such as erroneous write or read disturb (weak write occurring when a voltage is produced between the word line and substrate) may easily occur.

BRIEF SUMMARY OF THE INVENTION

The present invention has been made in consideration of the above circumstances, and its object is to provide a non-volatile semiconductor memory device and a method of manufacturing the same, wherein a variation in potential VFG due to a variation in coupling ratio γpgm can be suppressed, and defects such as erroneous write, in which electrons are erroneously injected in a floating gate of a cell non-selected for write or a cell designated for "1" write, or read disturb can be prevented.

In order to achieve the above object, according to a first aspect of the invention, there is provided a non-volatile semiconductor memory device comprising:

a device isolation insulation layer, formed on a semiconductor substrate, for defining a device region;

a floating gate formed above the device region and having a pair of first side faces opposed to a side face of the device isolation insulation layer which is located on the device region side;

a control gate formed above the floating gate; and a booster electrode having faces opposed to a pair of second surfaces of the floating gate which are substantially perpendicular to the pair of first side faces;

wherein a distance between the pair of first side faces of the floating gate is equal or not more than a width of the device region defined by the device isolation insulation layer.

According to a second aspect of the invention, there is provided the device of the first aspect, further comprising:

a first insulation film formed between the floating gate and the substrate;

a second insulation film formed between the floating gate and the control gate; and a third insulation film formed between the floating gate and the booster electrode.

According to a third aspect of the invention, there is provided the device of the first aspect, wherein a plurality of stacked gates each having the floating gate and the control gate are formed on the semiconductor substrate, and the booster electrode is formed between adjacent two of the stacked gates.

According to a fourth aspect of the invention, there is provided the device of the first aspect, further comprising a plug for contact with a bit line, the plug being formed of the same conductive material as the booster electrode.

According to a fifth aspect of the invention, there is provided the device of the first aspect, further comprising a wiring formed of the same conductive material as the booster electrode.

According to a sixth aspect of the invention, there is provided the device of the first aspect, wherein the control gate comprises:

a first conductive film formed above the floating gate; and a second conductive film formed on the first conductive film and the device isolation insulation film.

According to a seventh aspect of the invention, there is provided the device of the first aspect, further comprising an insulation layer formed on the control gate.

According to an eighth aspect of the invention, there is provided the device of the first aspect, wherein the distance between the pair of first side faces is substantially equal to the width of the device region.

According to a ninth aspect of the invention, there is provided the device of the first aspect, wherein the device isolation insulation layer is formed of an insulation material being buried in a trench formed on the semiconductor substrate, the trench being self-aligned with the pair of first side faces of the floating gate.

According to a tenth aspect of the invention, there is provided a non-volatile semiconductor memory device comprising:

a floating gate formed above a semiconductor substrate via a first insulation film;

a control gate opposed to a first face of the floating gate via a second insulation film; and a booster electrode opposed to a second face of the floating gate via a third insulation film, wherein a width of the floating gate opposed to the semiconductor substrate via the first insulation film, a width of the floating gate opposed to the control gate via the second insulation film and a width of the floating gate opposed to the booster electrode via the third insulation film are substantially equal one another.

According to an 11th aspect of the invention, there is provided the device of the 10th aspect, wherein a cell array portion is formed, where a plurality of stacked gates in which the floating gate and the control gate are stacked each other are provided, and the booster electrode is buried between the stacked gates adjacent to each other.

According to a 12th aspect of the invention, there is provided the device of the 10th aspect, wherein the control gate comprises a first portion capacitive coupling with the floating gate via the second insulation film and a second potion for connecting the first portion to an other first portion adjacent to the first portion each other.

According to a 13th aspect of the invention, there is provided a method of fabricating a non-volatile semiconductor device, comprising the steps of:

forming a first film on a semiconductor substrate of a first conductivity type, the first film including at least a first conductive film and a first insulating film for insulation between the first conductive film and the substrate;

removing an area of the first film, which corresponds to a device isolation region, and forming a device region and a device isolation trench on the substrate in a self-alignment manner with a remaining portion of the first film;

filling an insulation material in the device isolation trench;

forming a second film on the first film and the insulation material, the second film including at least a second conductive film capacitively coupled to a portion of the substrate which corresponding to the device region, with the first conductive film interposed;

removing that portion of the first film and the second film, which corresponds to semiconductor active regions of a second conductivity type to be formed on the device region, thus forming stacked gates each including a floating gate formed of the first conductive film and self-aligned with the device region and a word line formed of the second conductive film and capacitively coupled to the floating gate;

forming the semiconductor active regions in the substrate in a self-alignment manner with the stacked gates and the insulation material; and forming a booster electrode capacitively coupled, with an insulation layer interposed, to the floating gate, the word line and the semiconductor active regions in regions functioning as a source and a drain of a memory cell.

According to a 14th aspect of the invention, there is provided the method of the 13th aspect, wherein the booster electrode is buried in each of recesses formed between the stacked gates.

According to a 15th aspect of the invention, there is provided the method of the 13th aspect, wherein the second conductive film is electrically connected to the first conductive film in regions where select transistors are formed and electrically insulated from the first conductive film in regions where memory cells are formed.

According to a 16th aspect of the invention, there is provided the method of the 15th aspect, wherein the step of forming the stacked gates comprises a step of forming select gate lines in which the first conductive film and the second conductive film are electrically connected.

According to a 17th aspect of the invention, there is provided the method of the 16th aspect, wherein the booster electrode is formed by filling the conductive material in recesses between adjacent two of the select gate lines, recesses between the select gate line and the stacked gate and recesses between adjacent two of the stacked gates, and then removing the conductive material from the recesses between adjacent two of the select gate lines.

According to a 18th aspect of the invention, there is provided the method of the 13th aspect, wherein the semiconductor active regions of the second conductivity type comprise first regions functioning as a source and a drain of the memory cell, a second region connected to a source wiring and a third region connected to a bit line, and the step of forming the booster electrode comprises a step of forming the source wiring of the same conductive material as the booster electrode electrically connected to the second region and a bit line contact plug of the same conductive material as the booster electrode electrically connected to the third region.

According to a 19th aspect of the invention, there is provided the method of the 13th aspect, wherein the word line comprises:

a first conductive layer formed above the floating gate; and a second conductive layer formed on the first conductive layer and the device isolation region.

According to a 20th aspect of the invention, there is provided the method of the 13th aspect, further comprising an insulation cap layer formed on the word line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 25A is a plan view illustrating a manufacturing step of the memory cell according to the third embodiment of the invention;

FIG. 25B is a cross-sectional view taken along line 25B—25B in FIG. 25A;

FIG. 25C is a cross-sectional view taken along line 25C—25C in FIG. 25A;

FIG. 26A is a plan view illustrating a manufacturing step of the memory cell according to the third embodiment of the invention;

FIG. 26B is a cross-sectional view taken along line 26B—26B in FIG. 26A;

FIG. 26C is a cross-sectional view taken along line 26C—26C in FIG. 26A;

FIG. 27A is a plan view illustrating a manufacturing step of the memory cell according to the third embodiment of the invention;

FIG. 27B is a cross-sectional view taken along line 27B—27B in FIG. 27A;

FIG. 27C is a cross-sectional view taken along line 27C—27C in FIG. 27A;

FIG. 28A is a plan view illustrating a manufacturing step of the memory cell according to the third embodiment of the invention;

FIG. 28B is a cross-sectional view taken along line 28B—28B in FIG. 28A;

FIG. 28C is a cross-sectional view taken along line 28C—28C in FIG. 28A;

DETAILED DESCRIPTION OF THE INVENTION

Figure 1A:
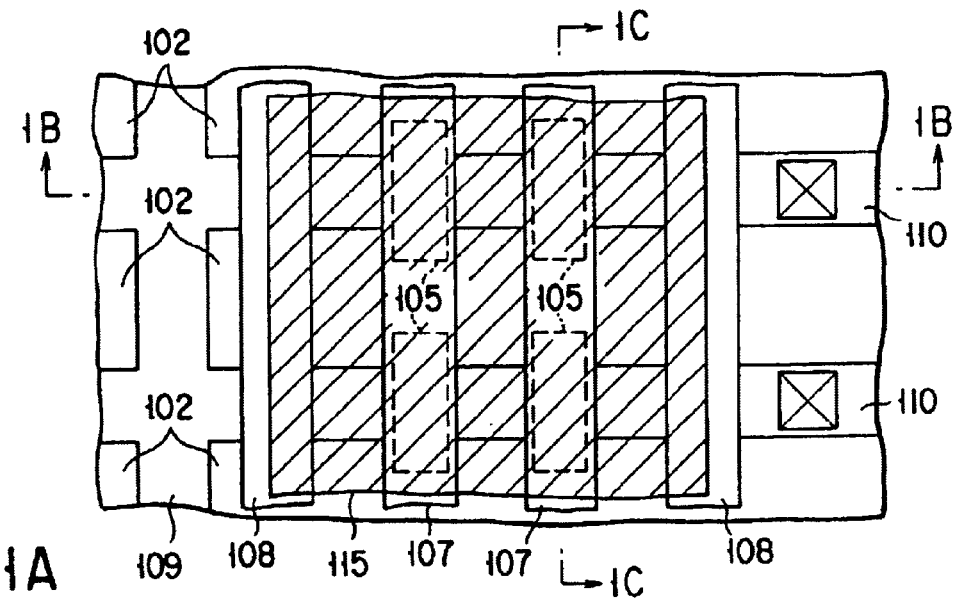
FIG. 1A is a plan view of a conventional memory cell.
Figure 1B:
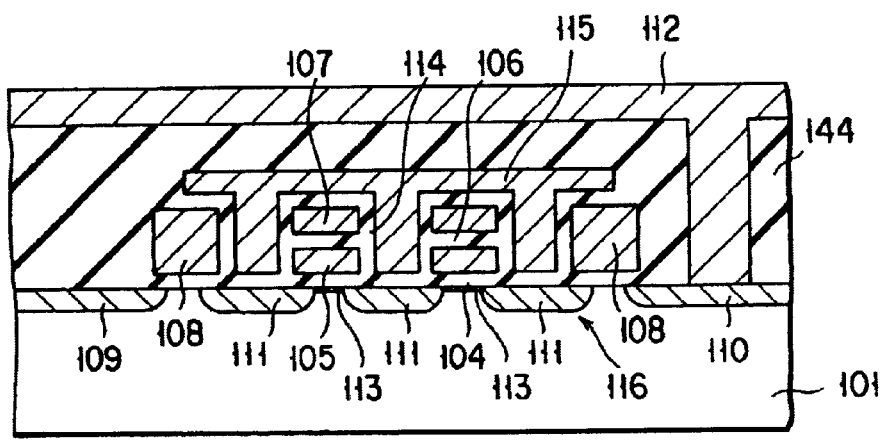
FIG. 1B is a cross-sectional view taken along line B—B in FIG. 1A.
Figure 1C:
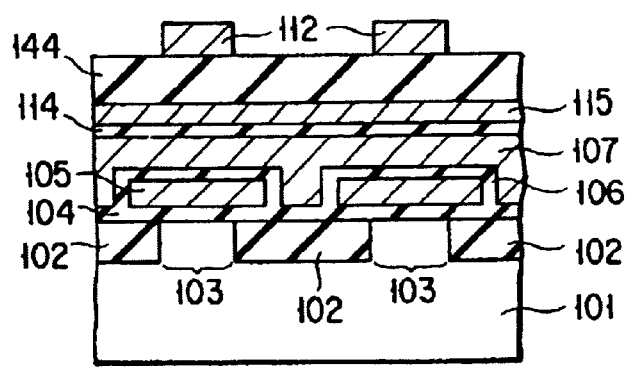
FIG. 1C is a cross-sectional view taken along line C—C in FIG. 1A.
Figures 2A, 2B:
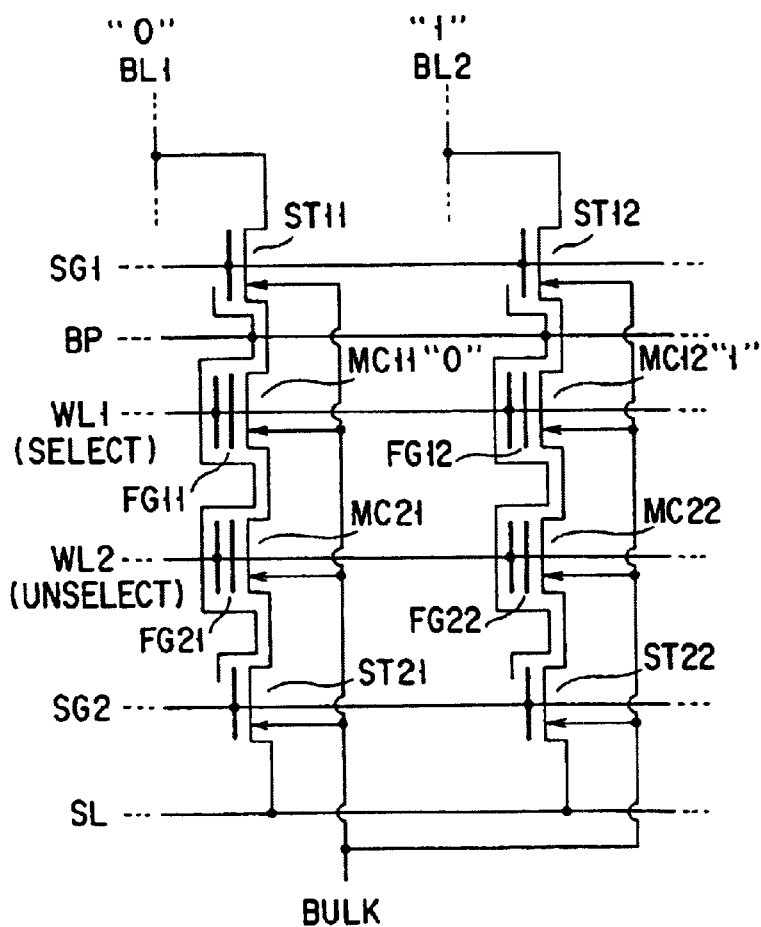
FIG. 2A is an equivalent circuit diagram of a conventional EEPROM.
FIG. 2B shows a relationship between node potentials in the write mode.
Figure 3:
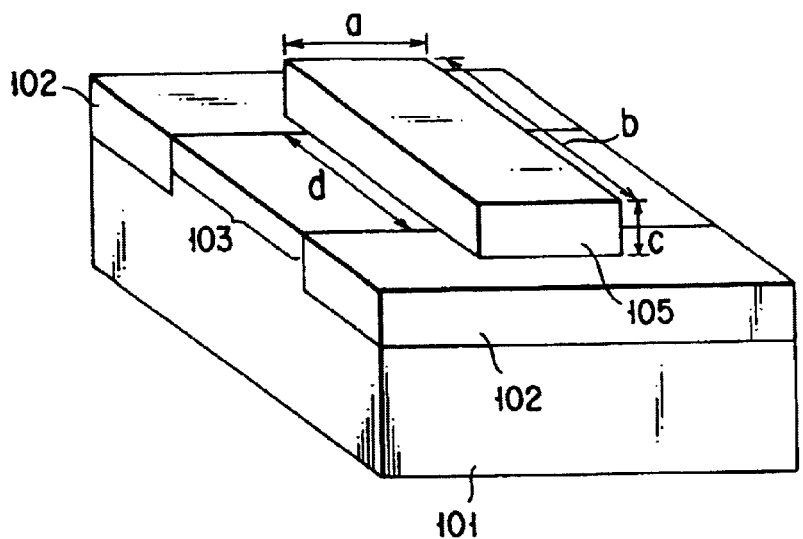
FIG. 3 is a bird's eye view of a conventional floating gate.
Figure 4:
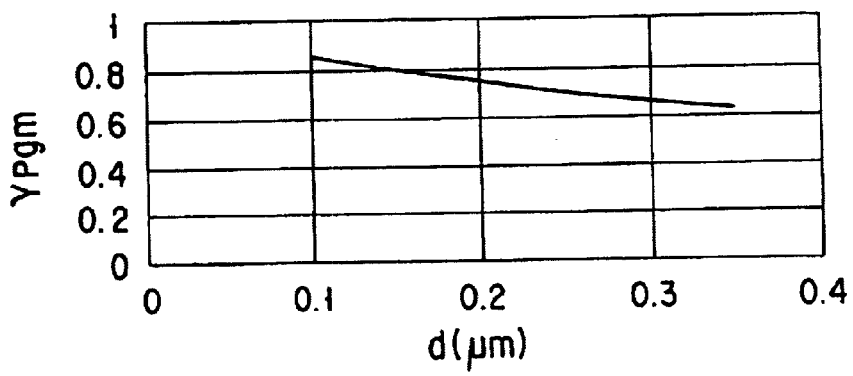
FIG. 4 is a graph showing the dependency of a coupling ratio upon the width of a device region.

Embodiments of the present invention will now be described with reference to the accompanying drawings, referring to a NAND type EEPROM as an example. In the drawings, common parts are denoted by like reference numerals, and an overlapping description will be omitted.

Figure 5A:
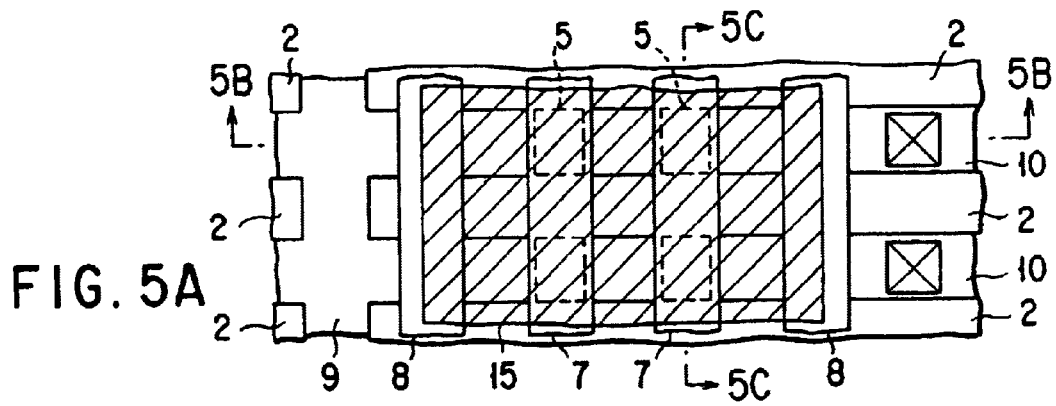
FIG. 5A is a plan view of a memory cell according to a first embodiment of the invention.
Figure 5B:
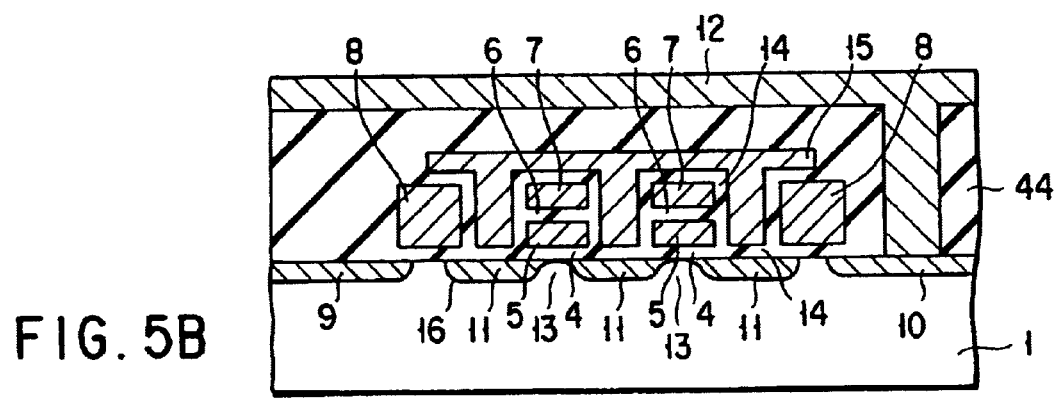
FIG. 5B is a cross-sectional view taken along line 5B—5B in FIG. 5A.
Figure 5C:
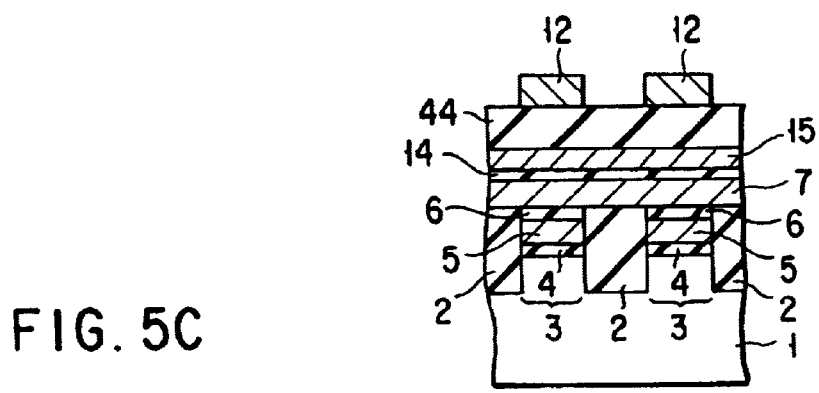
FIG. 5C is a cross-sectional view taken along line 5C—5C in FIG. 5A.

FIG. 5A is a plan view of an EEPROM cell according to a first embodiment of the invention, FIG. 5B is a cross-sectional view taken along line 5B—5B in FIG. 5A, and FIG. 5C is a cross-sectional view taken along line 5C—5C in FIG. 5A. For the purpose of simple description, FIG. 5A does not show the bit line and the underlying interlayer insulation film.

As is shown in FIGS. 5A to 5C, device isolation insulation films 2 are formed in a surface portion of a P-type silicon substrate (BULK) 1. Device regions 3 are defined on a surface of the substrate 1 by the device isolation insulation films 2.

A tunnel insulation film 4, a floating gate (FG) 5, an insulation film 6 and a control gate (word line WL) 7 are successively formed in a stacked-gate structure. Reference numeral 8 denotes a gate of a select transistor.

N-type diffusion layers 9, 10 and 11 are formed in the device region 3. The diffusion layer 9 is connected to a source line (SL) (not shown), and the diffusion layer 10 is to a bit line (BL) 12.

The number of diffusion layers 11 is two or more and these layers 11 function as channels 13 of memory cell transistors (MC), respectively. The control gate 7 crosses over the channels 13 and are capacitively coupled to the channels 13 through the floating gates 5.

A booster electrode insulating film 14 is formed over the periphery of the stacked-gate structure and is formed on the diffusion layers 11, respectively. A booster electrode 15 is formed on the insulating film 14. An interlayer insulation film 44 is formed on the booster electrode 15.

Figure 6:
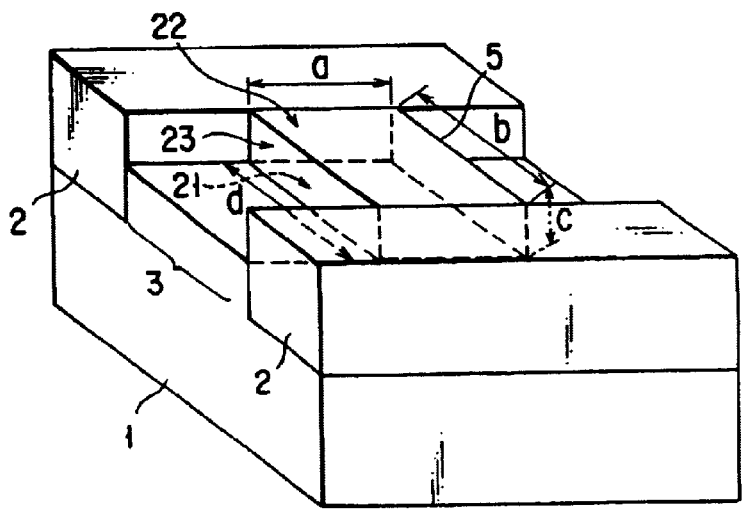
FIG. 6 is a bird's eye view of a floating gate of the memory cell according to the present invention.

FIG. 6 is a bird's eye view of the floating gate shown in FIGS. 5A to 5C.

The cell of this invention is characterized in that, as shown in FIG. 6, the width of a plane 21 of the floating gate FG opposed to the channel 13 with tunnel insulating film 4 interposed, the width of a plane 22 opposed to the word line WL with insulation film 6 interposed and the width of a plane 23 opposed to the booster electrode 15 with booster electrode insulating film 14 interposed are equal to one another.

The three widths are the width "b" of the floating gate 5 along the word line. The width "b" is equal to the width "d" of device region 3 between the device isolation regions 2. Therefore, the effective coupling ratio γpgm in the write mode is different from the ratio in the prior art, i.e.

$$\gamma pgm=(C2+C3)/(C1+C2+C3)=[\{(b+2c)a/tox2\}+\{(2b\cdot c)/tox3\}]/[\{(a\cdot d)/tox1\}+\{(b+2c)a/tox2\}+\{(2b\cdot c)/tox3\}]$$

and is expressed by $$\gamma pgm=(C2+C3)/(C1+C2+C3)=[\{(d\cdot a)/tox2\}+\{(2d\cdot c)/tox3\}]/[\{(a\cdot d)/tox1\}+\{(a\cdot d)/tox2\}+\{(2d\cdot c)/tox3\}]$$

Accordingly, the coupling ratio does not depend on the width "d" ("b").

In the above equation, suppose that the dimension of the floating gate 5 along the bit line is "a", the dimension of floating gate 5 along the word line is "b", the height of floating gate 5 is "c", and the width of the device region is "d". In addition, suppose that the thickness of the tunnel insulation film 4 between the substrate 1 and floating gate 5 is "tox1", the thickness of the insulation film 6 between the floating gate 5 and control gate 7 is "tox2", and the thickness of the booster electrode insulating film 14 between the floating gate 5 and booster electrode 15 is "tox3."

Similar with the above-described prior art, the capacitances C1, C2 and C3 are the capacitance between the substrate 1 and floating gate 5, the capacitance between the floating gate 5 and control gate 7 and the capacitance between the floating gate 5 and booster electrode 15, respectively.

Since the coupling ratio γpgm does not depend on the width "d", the variance in coupling ratio γpgm is not greatly influenced even by the width "d" of device region 3 varies due to a processing variance.

In the present invention, as regards the factors of the variance in coupling ratio γpgm, in particular, the variance in width "d" of device region 3, which is one of the factors, can be eliminated. In this invention, the variance in coupling ratio γpgm can be reduced accordingly, compared to the prior art.

Still more, even if the width "b" along a word line of the floating gates is not equal to the width "d" of the device region 3, if a side surface along a column direction of the floating gates 5 opposes to the device isolation regions 2 but does not oppose to control gate 7, as shown in FIG. 6, the condition which is not depending on width "d" of the device region 3 is satisfied as described above with regard to the coupling ratio γpgm. In other word, in the case where a relation between the width "b" along a word line of the floating gates 5 and width "d" of the device region 3 is set to be "b≦d", it should suffice if a surface along a column direction of the floating gates 5 is opposed to the device isolation region 2.

Since the variance in coupling ratio γpgm is reduced, the possibility of occurrence of a cell in which electrons are easily injected decreases, compared to the prior art. Defects such as erroneous write or read disturb can be more prevented than in the prior art.

Figures 7A, 7B, 7C, 7D:
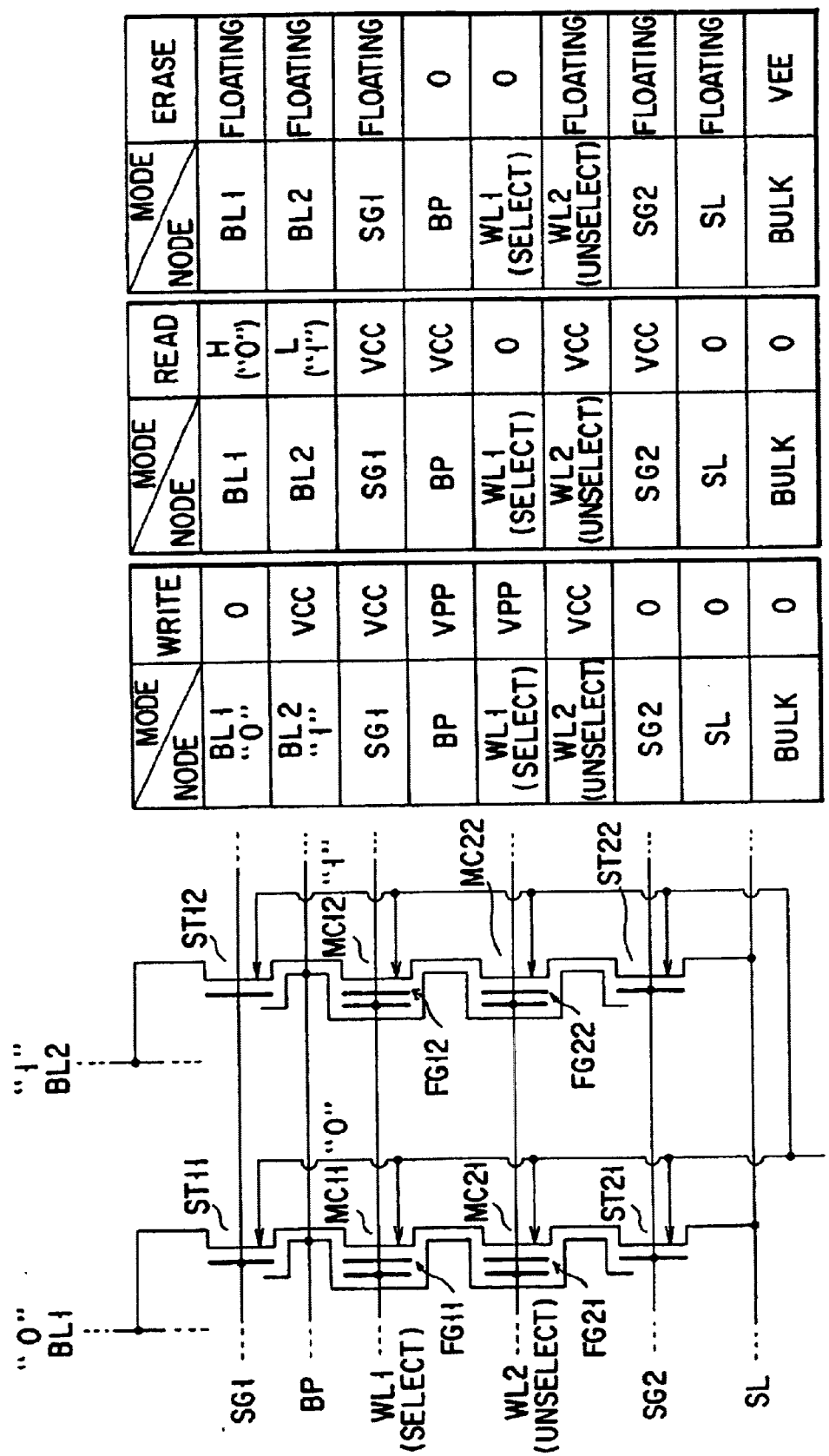
FIG. 7A is an equivalent circuit diagram of an EEPROM having the memory cell according to the first embodiment of the invention.
FIG. 7B shows a relationship between node potentials in the write mode.
FIG. 7C shows a relationship between node potentials in the read mode.
FIG. 7D shows a relationship between node potentials in the erase mode.

An operation method of the NAND type EEPROM according to the first embodiment of the invention will now be described. FIG. 7A is an equivalent circuit diagram of the EEPROM, FIG. 7B shows a relationship between node potentials in a write mode, FIG. 7C shows a relationship between node potentials in a read mode, and FIG. 7D shows a relationship between node potentials in a erase mode. For the purpose of simple description, FIG. 7A shows the case where two word lines (WL1, WL2) and two bit lines (BL1, BL2) are provided.

At first the write operation will be described.

The potential of the selected word line WL1 is set at 13V, the potential of the booster electrode BP is at 13V, the potential of the bit line BL1 designated for "0" write is at 0V, the potential of the drain-side select gate line SG1 is at 3.3V, the potential of the source-side select gate line SG2 is at 0V, and the potential of the non-selected word line WL2 is at 3.3V.

At this time, the potentials of both the write-selected word line WL1 and booster electrode BP are 13V. Although the gate potential of the cell MC11 having the gate connected to the word line WL1 is 13V, the effective coupling ratio γpgm in the write mode is increased to "0.78" by the booster electrode BP, and a potential of about 10V is applied to the tunnel insulation film.

Accordingly, even if the write potential is 13V, electrons are injected into the floating gate FG11 through the tunnel insulation film about 10 nm thick. Thus, "0" write is effected in the cell MC11.

On the other hand, the gate potential of the cell MC21 belonging to the same bit line BL1 and having the gate connected to the non-selected word line WL2 is 3.3V, and the potential of the booster electrode BP is 13V. At this time, the voltage of 3.3V applied to the word line WL2 acts to lower the potential of the floating gate FG21. Thus, no electrons are injected in the floating gate FG21.

On the other hand, the potential of the bit line BL2 designated for "1" write is 3.3V. Since the potential of the drain-side select gate line SG1 is 3.3V at this time, the select transistor ST12 is cut off when the potential of "3.3V−VthST" has been transferred to the N-type diffusion layer 7. As a result, the cell channel 16 including the diffusion layer 11 shown in FIG. 5B and channel 13 is set in the floating state.

In this case, "VthST" is a threshold voltage of the select transistor ST12. At this time the potential of the cell channel 16 is raised by the potential of booster electrode BP.

The potential, 13V, of the selected word line WL1 contributes to raising the potential of cell channel 16 through the floating gate FG12. In this manner the potential of cell channel 16 is raised up to about 8V.

In the cell MC12 having the gate connected to the selected word line WL1, a potential difference between the channel thereof and the word line WL1 decreases to "13V−8V=5V" and no electrons are injected in the floating gate FG12.

Thus, data "1" is written in the cell MC12. As described above, in the EEPROM having the booster electrode BP, the potential of the cell channel 16 is greatly raised up to about 8V in the write-selected cell MC12 connected to the bit line BL2 designated for "1" write.

In addition, in the cell MC22 having the gate connected to the non-selected word line WL2, a potential difference between the channel thereof and the word line WL2 is "3.3V−8V=−4.7V" and no electrons are injected in the floating gate FG22.

Next, the read mode will be described.

The potential of the word line WL1 selected for data read (read-selected word line WL1) is set at 0V, and the potentials of the booster electrode BP, drain-side select gate line SG1 and source-side select gate line SG2 are set at 3.3V, respectively.

The non-selected word line WL2 is set at a potential at which it is turned on independently of the state of the threshold voltage of the cell MC 21, MC22. In this embodiment, this potential is 3.3V.

Since the cell MC11 is "0"-written (electrons being injected), its threshold voltage is 0V or above. Since the cell MC12 is "1"-written (no electrons being injected), its threshold voltage is 0V or less.

Since the potential of the read-selected word line WL1 is 0V, the cell MC11 is turned off and the cell MC12 is turned on. Thereby, the potentials of the bit lines BL1 and BL2, which are pre-charged prior to data read, are at "H" level (non-discharged) and at "L" level (discharged), respectively.

These potentials are amplified by sense amplifiers (not shown), and thus data "0" is read out from the cell MC11 and data "1" is read out from the cell MC12.

The erase operation will now be described.

The potential of the word line WL1 selected for data erase (erase-selected word line WL1) and the potential of the booster electrode BP) are set at 0V. The bit lines BL1 and BL2, source-side select gate line SG1, drain-side select gate line SG2, source line SL and non-selected word line WL2 are set in the floating state.

The potential of the substrate BULK is set at 13V. Thus, a positive voltage relative to the floating gates FG11 and FG21 is applied to the substrate BULK, and electrons injected in the floating gate FG11 is released to the substrate BULK. Accordingly, the data in the cells MC11 and MC21 is erased.

As regards the cells MC12 and MC22, since the word line WL2 is in the floating state, the potential of the word line WL2 is coupled to the substrate BULK and increased.

As a result, the electrons injected in the floating gates FG12 and FG22 are not released. Of course, if the potential of the word line WL2 is set at 0V, the data in the cells MC11, MC21, MC12 and MC22 can be erased at a time.

A method of fabricating the EEPROM according to the first embodiment will now be described.

FIGS. 8 to 16 illustrate principal manufacturing steps of the EEPROM according to the first embodiment of the invention. In FIGS. 8 to 16, each FIG. A is a plan view, each FIG. B is a cross-sectional view taken along line B—B in FIG. A, and each FIG. C is a cross-sectional view taken along line C—C in FIG. A.

Figure 8A:
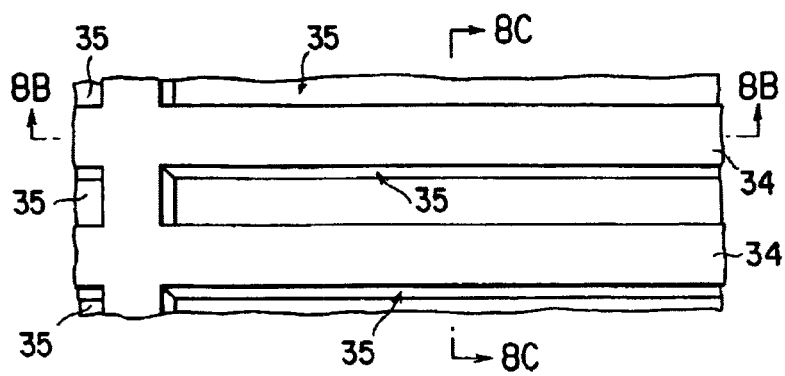
FIG. 8A is a plan view illustrating a manufacturing step of the memory cell according to the first embodiment of the invention.
Figure 8B:
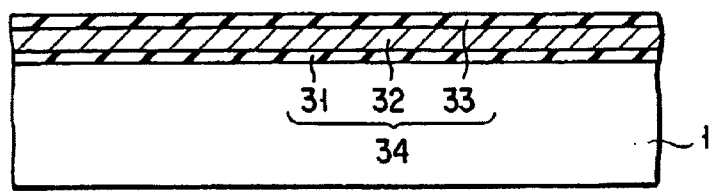
FIG. 8B is a cross-sectional view taken along line 8B—8B in FIG. 8A.
Figure 8C:
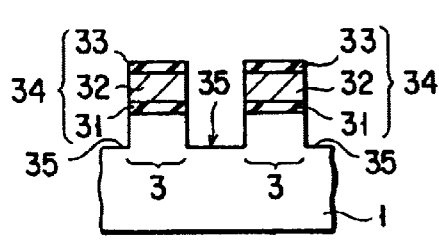
FIG. 8C is a cross-sectional view taken along line 8C—8C in FIG. 8A.

As is shown in FIGS. 8A to 8C, a first stacked-film structure 34 is formed on a P-type silicon substrate 1. The first stacked-film structure 34 comprises a silicon dioxide film 31 which will become a tunnel insulation film, a conductive polysilicon layer 32 which will become a floating gate, and a silicon nitride film 33 which will become a mask in forming a device isolation trench.

That portion of the silicon nitride film 33, which corresponds to the trench, is removed, and the silicon nitride film 33 is patterned in accordance with the device region. Then, using the silicon nitride mask 33 as-a mask, the substrate 1 is etched. The device region 3 is formed in a self-alignment manner at the left portion of the first stacked-film structure 34, and the device isolation trench 35 is formed in the substrate 1.

Figure 9C:
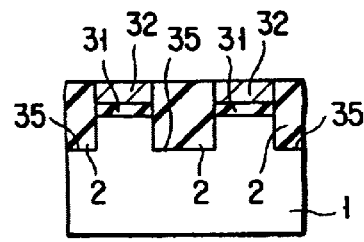
FIG. 9C is a cross-sectional view taken along line 9C—9C in FIG. 9A.
Figure 9A:
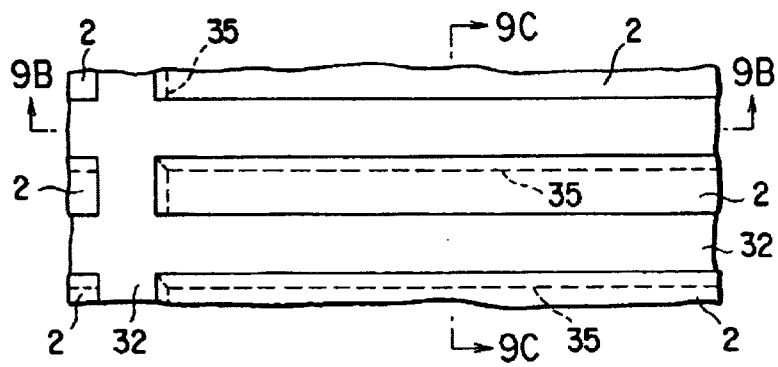
FIG. 9A is a plan view illustrating a manufacturing step of the memory cell according to the first embodiment of the invention.
Figure 9B:
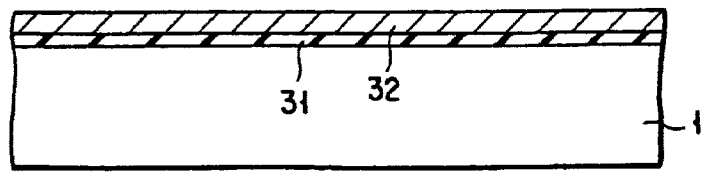
FIG. 9B is a cross-sectional view taken along line 9B—9B in FIG. 9A.

As is shown in FIGS. 9A to 9C, silicon dioxide is deposited on the structure shown in FIGS. 8A to 8C, and a silicon dioxide film to be buried in the trench 35 is formed.

The silicon dioxide film is subjected to chemical mechanical polishing (CMP), and the silicon nitride film is buried in the trench 35 and the device isolation region 2 is formed. Then, the silicon nitride film 33, if it is left, is removed.

Figure 10A:
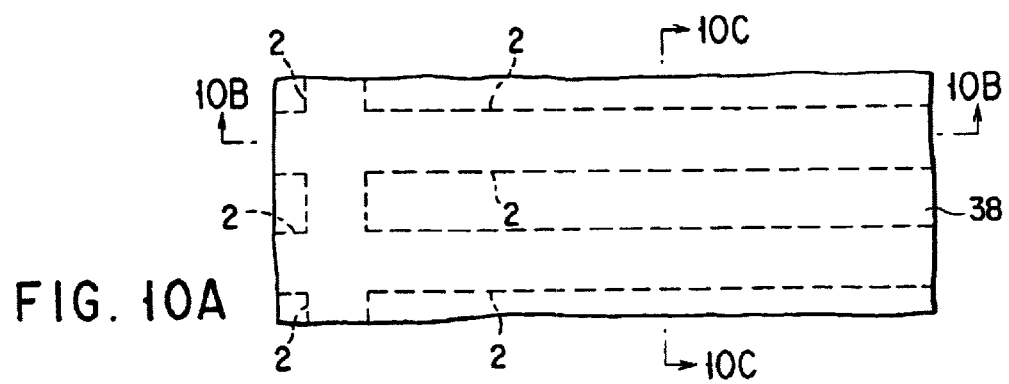
FIG. 10A is a plan view illustrating a manufacturing step of the memory cell according to the first embodiment of the invention.
Figure 10B:
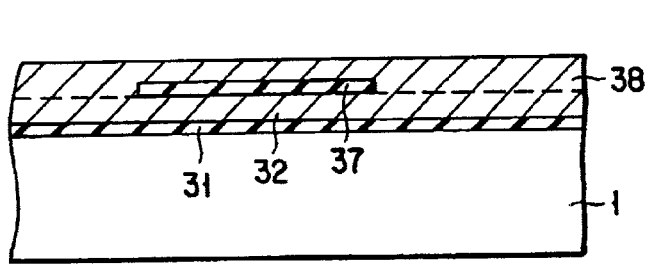
FIG. 10B is a cross-sectional view taken along line 10B—10B in FIG. 10A.
Figure 10C:
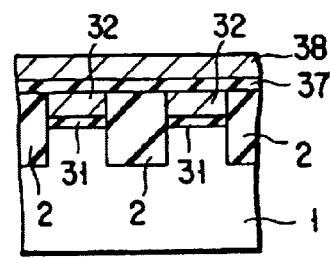
FIG. 10C is a cross-sectional view taken along line 10C—10C in FIG. 10A.

Subsequently, as shown in FIGS. 10A to 10C, an ONO film 37 which will become an insulation film is formed by successively depositing silicon dioxide, silicon nitride, and silicon dioxide on the structure shown in FIGS. 9A to 9C.

That portion of the ONO film 37, which will become the gate of the select gate transistor, is removed and a conductive polysilicon film 38 which will become the word line (control gate) is deposited.

Figure 11A:
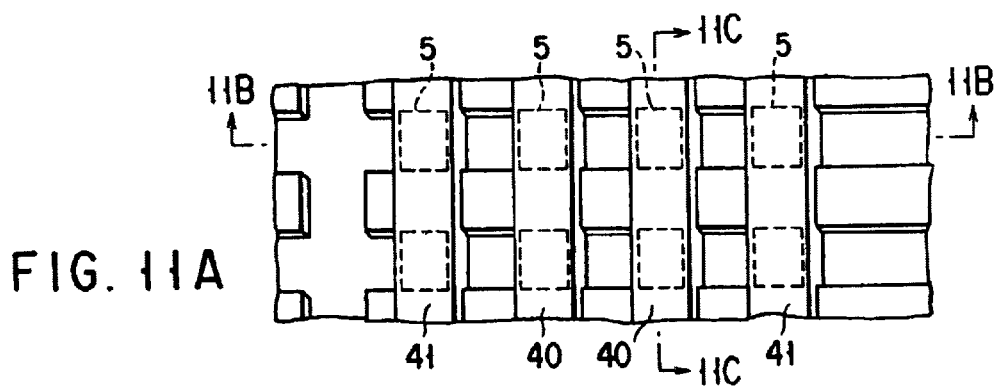
FIG. 11A is a plan view illustrating a manufacturing step of the memory cell according to the first embodiment of the invention.
Figure 11B:
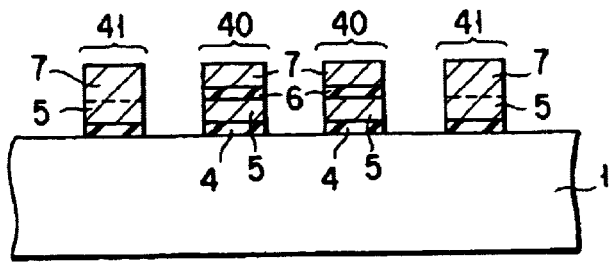
FIG. 11B is a cross-sectional view taken along line 11B—11B in FIG. 11A.
Figure 11C:
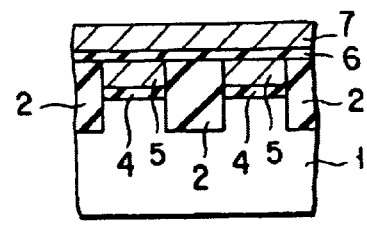
FIG. 11C is a cross-sectional view taken along line 11C—11C in FIG. 11A.

Then, as shown in FIGS. 11A to 11C, the film structure including the silicon dioxide film 31, conductive polysilicon film 32, ONO film 37 and conductive polysilicon film 38 is patterned to have a word line pattern, and a stacked-gate structure 40 including the tunnel insulation film 4, floating gate 5, film 6 and word line 7 is formed.

At this time, the floating gate 5 is formed on the device region 3 in a self-alignment manner. In addition, in the region of the select gate transistor, a gate structure 41 wherein the insulation film 6 is not provided and the floating gate 5 and word line 7 are electrically connected is formed.

Figure 12A:
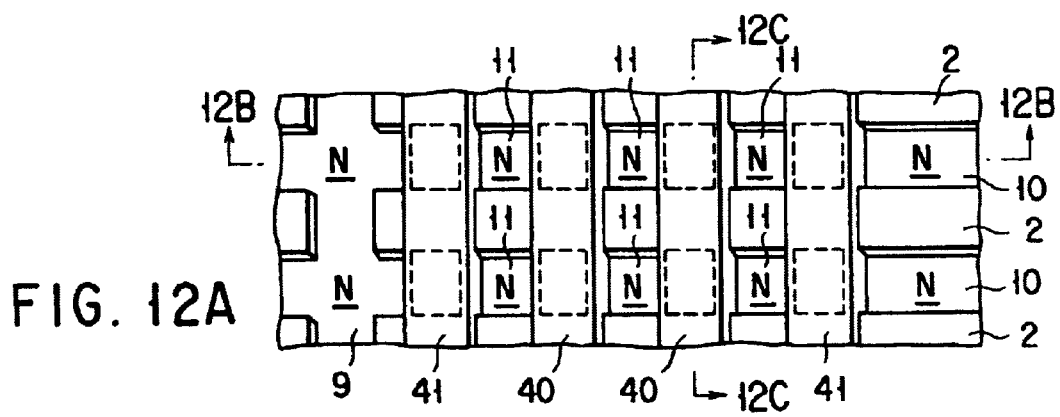
FIG. 12A is a plan view illustrating a manufacturing step of the memory cell according to the first embodiment of the invention.
Figure 12B:
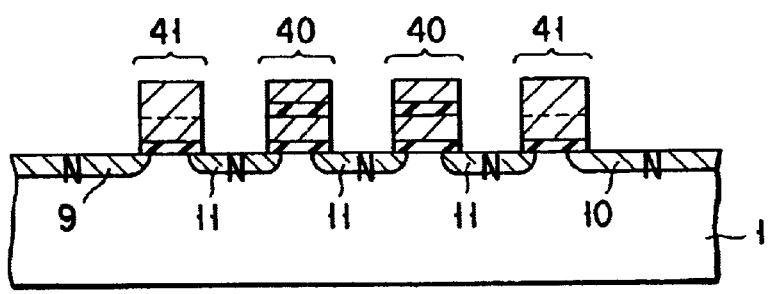
FIG. 12B is a cross-sectional view taken along line 12B—12B in FIG. 12A.
Figure 12C:
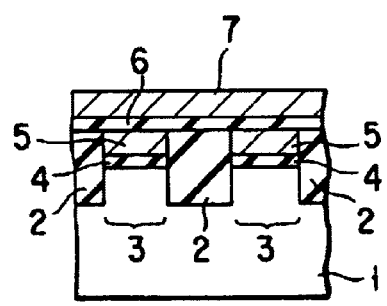
FIG. 12C is a cross-sectional view taken along line 12C—12C in FIG. 12A.

As is shown in FIGS. 12A to 12C, using the stacked-gate structure 40, gate structure 41 and device isolation region 2 as a mask, N-type impurities are ion-implanted in the device regions 3 and then diffused to form N-type diffusion layers 9, 10 and 11.

Figure 13A:
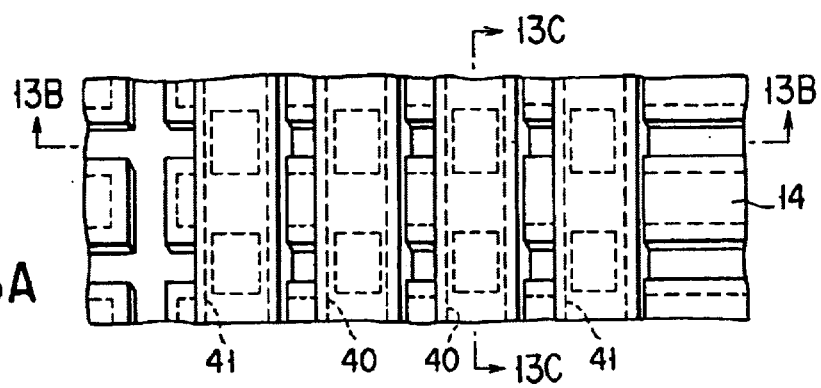
FIG. 13A is a plan view illustrating a manufacturing step of the memory cell according to the first embodiment of the invention.
Figure 13B:
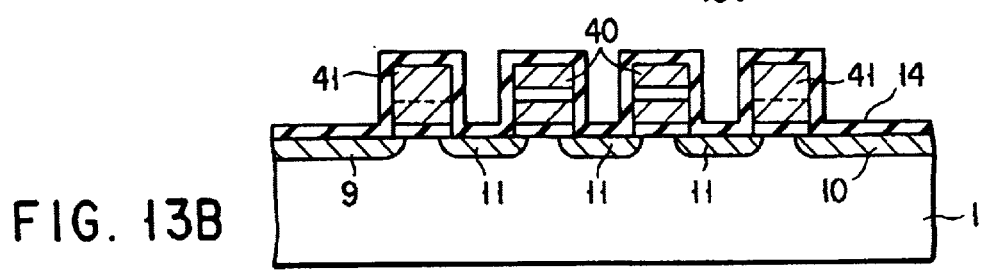
FIG. 13B is a cross-sectional view taken along line 13B—13B in FIG. 13A.
Figure 13C:
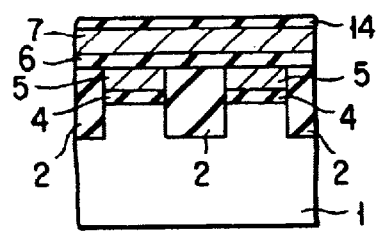
FIG. 13C is a cross-sectional view taken along line 13C—13C in FIG. 13A.

As is shown in FIGS. 13A to 13C, silicon dioxide is deposited on the structure shown in FIGS. 12A to 12C and the booster electrode insulation film 14 is formed.

Figure 14C:
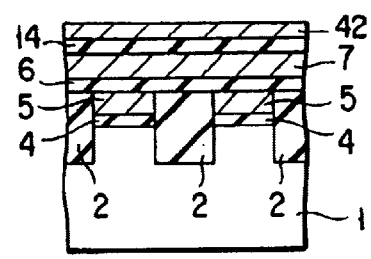
FIG. 14C is a cross-sectional view taken along line 14C—14C in FIG. 14A.
Figure 14A:
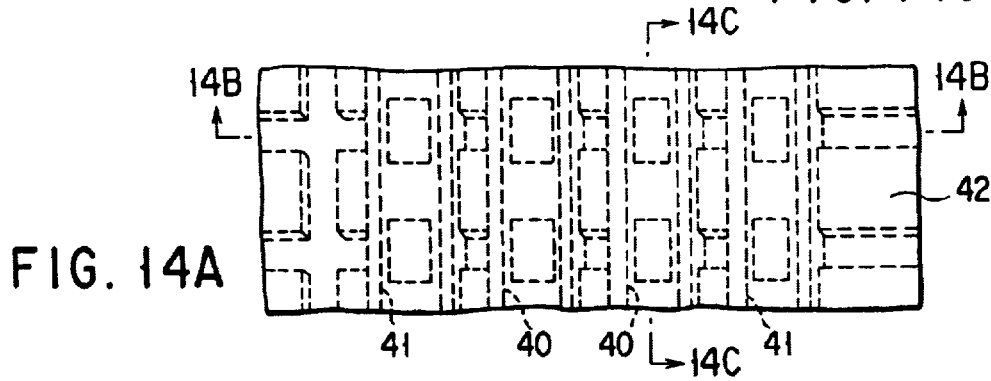
FIG. 14A is a plan view illustrating a manufacturing step of the memory cell according to the first embodiment of the invention.
Figure 14B:
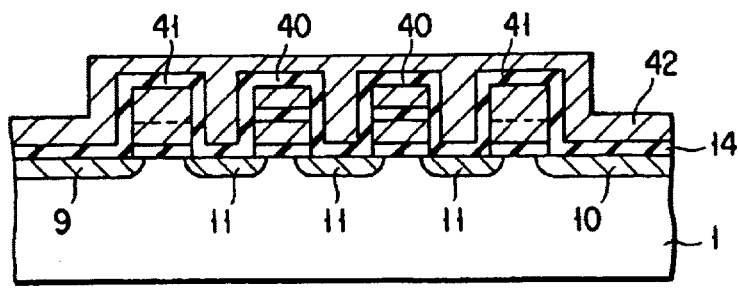
FIG. 14B is a cross-sectional view taken along line 14B—14B in FIG. 14A.

As is shown in FIGS. 14A to 14C, conductive polysilicon is deposited on the booster electrode insulation film 14 and a conductive film 42 serving as a booster electrode is formed.

Figure 15A:
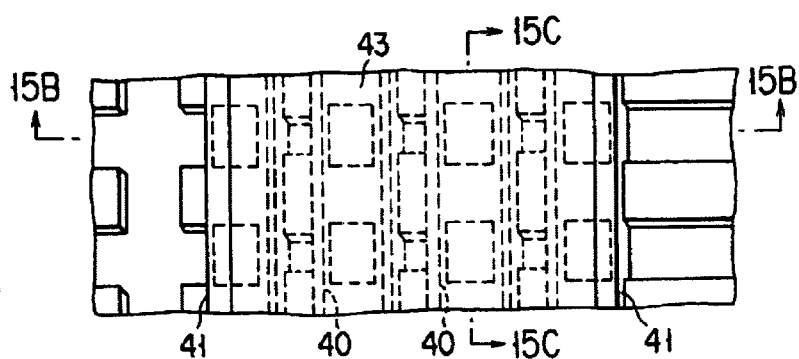
FIG. 15A is a plan view illustrating a manufacturing step of the memory cell according to the first embodiment of the invention.
Figure 15B:
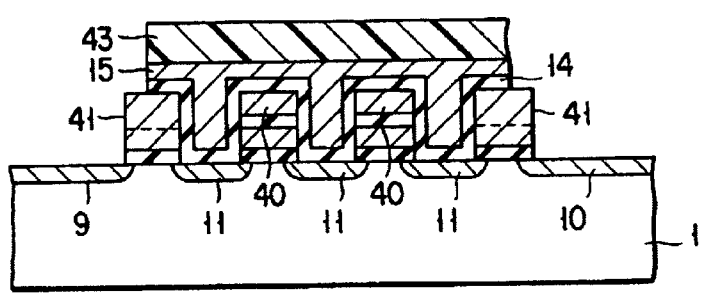
FIG. 15B is a cross-sectional view taken along line 15B—15B in FIG. 15A.
Figure 15C:
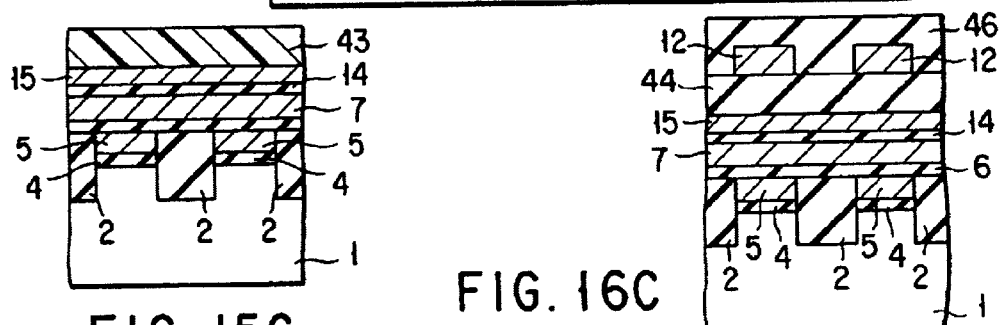
FIG. 15C is a cross-sectional view taken along line 15C—15C in FIG. 15A.

As is shown in FIGS. 15A to 15C, the conductive film 42 is patterned in a booster electrode pattern and a booster electrode 15 is formed. In FIGS. 15A to 15C, reference numeral 43 denotes a mask layer formed of a photoresist in accordance with the booster electrode pattern.

Figure 16C:
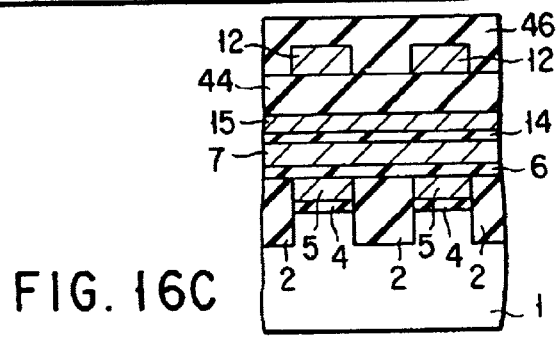
FIG. 16C is a cross-sectional view taken along line 16C—16C in FIG. 16A.
Figure 16A:
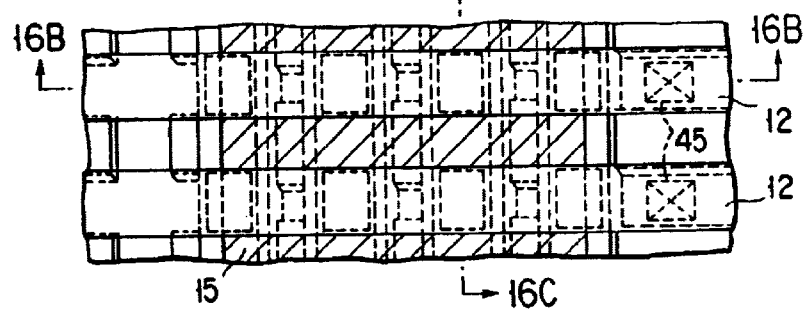
FIG. 16A is a plan view illustrating a manufacturing step of the memory cell according to the first embodiment of the invention.
Figure 16B:
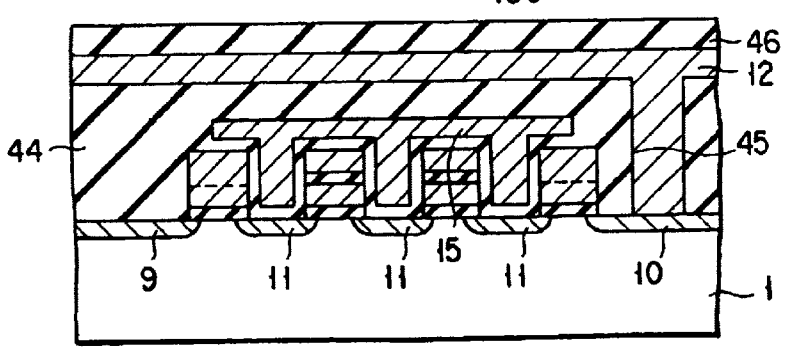
FIG. 16B is a cross-sectional view taken along line 16B—16B in FIG. 16A.

Subsequently, as shown in FIGS. 16A to 16C, silicon dioxide is deposited on the structure shown in FIGS. 15A to 15C and a first interlayer insulation film 44 is formed.

Then, a source line contact hole (not shown) communicating with the diffusion layer 9, a bit line contact hole 45 communicating with the diffusion layer 10, and a booster electrode control line contact hole (not shown) communicating with the booster electrode 15 are formed in the interlayer insulation film 44. Following this, a source line (not shown) and a booster electrode control line (not shown) are formed at the bit line.

At last, a second interlayer insulation film 46 is formed, and the fabrication of the EEPROM cell according to the first embodiment is completed.

An EEPROM cell according to a second embodiment of the invention will now be described.

Figure 17A:
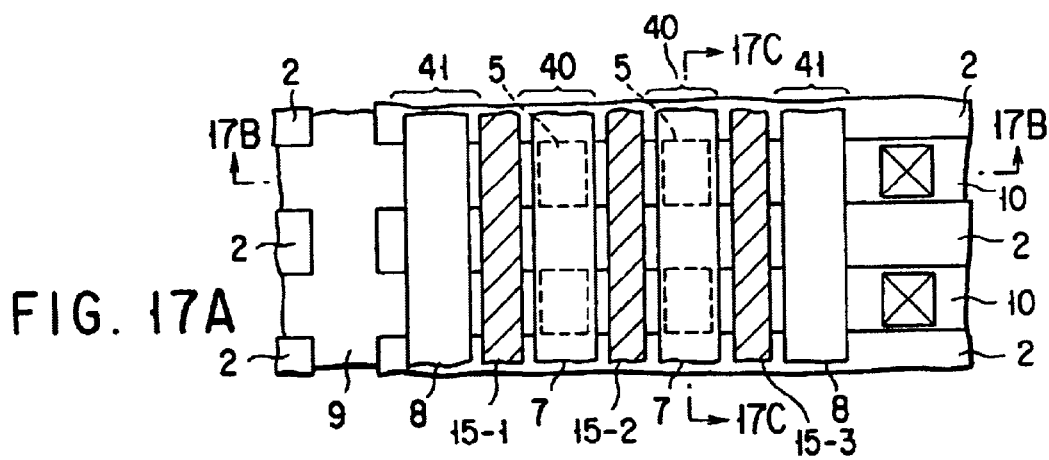
FIG. 17A is a plan view of a memory cell according to a second embodiment of the invention.
Figure 17B:
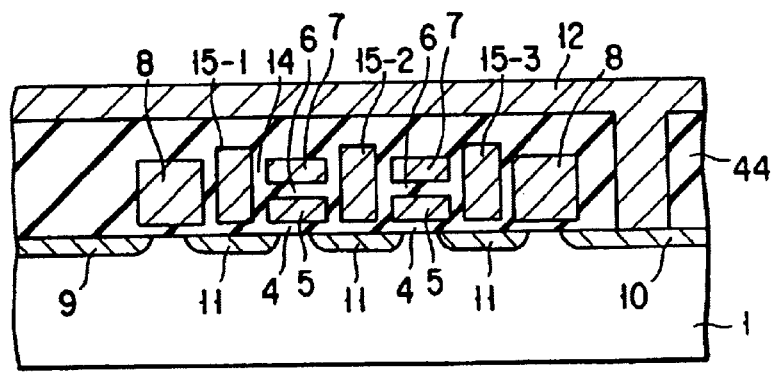
FIG. 17B is a cross-sectional view taken along line 17B—17B in FIG. 17A.
Figure 17C:
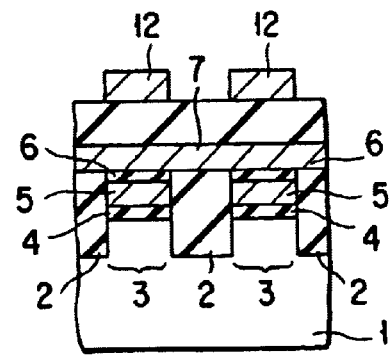
FIG. 17C is a cross-sectional view taken along line 17C—17C in FIG. 17A.

FIG. 17A is a plan view of the EEPROM cell according to the second embodiment, FIG. 17B is a cross-sectional view taken along line 17B—17B in FIG. 17A and FIG. 17C is a cross-sectional view taken along line 17C—17C in FIG. 17A. For the purpose of simple description, FIG. 17A does not show the bit line and the underlying interlayer insulation film.

In the second embodiment, as shown in FIGS. 17A to 17C, booster electrodes 15 are buried between stacked-gate structures 40 and between the stacked-gate structure 40 and gate structure 41, and the booster electrodes 15 are formed in a wiring shape in the cell array.

In FIGS. 17A to 17C, the booster electrodes 15 with the wiring shape are denoted by numerals 15-1 to 15-3. Hereinafter, these electrodes 15 are referred to as wiring-type boosters.

Figures 18A, 18B, 18C, 18D:
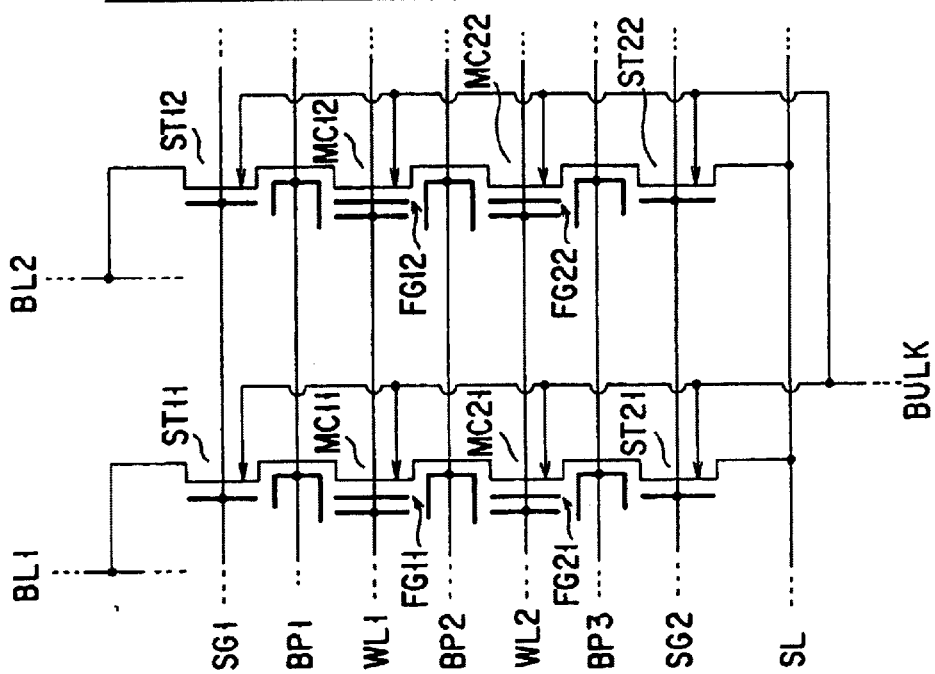
FIG. 18A is an equivalent circuit diagram of an EEPROM having the memory cell according to the second embodiment of the invention.
FIG. 18B shows a relationship between node potentials in the write mode.
FIG. 18C shows a relationship between node potentials in the read mode.
FIG. 18D shows a relationship between node potentials in the erase mode.

FIG. 18A is an equivalent circuit diagram of the EEPROM having the memory cell according to the second embodiment, FIG. 18B shows a relationship between node potentials in the write mode, FIG. 18C shows a relationship between node potentials in the read mode, and FIG. 18D shows a relationship between node potentials in the erase mode.

In the equivalent circuit shown in FIG. 18A, there are provided a first wiring-type booster electrode BP1 formed between select transistors ST11, ST12 and cells MC11, MC12, a second wiring-type booster electrode BP2 formed between cells MC11, MC12 and cells MC21, MC22, and a third wiring-type booster electrode BP3 formed between select transistors ST21, ST22 and cells MC21, MC22.

However, if the first to third wiring-type booster electrodes BP1 to BP3 are controlled simultaneously as one booster electrode BP, the same operations as in the first embodiment can be performed, as shown in FIGS. 18B to 18D.

In order to simultaneously control the first to third wiring-type booster electrodes BP1 to BP3 as single booster electrode BP, it is possible, for example, to interconnect the first to third booster electrodes BP1 to BP3 at an end portion of the cell array by means of patterning, or to interconnect them by using other wiring elements.

In the second embodiment, like the first embodiment, a variance in coupling ratio γpgm decreases. In addition, compared to, e.g. the cell of the first embodiment shown in FIG. 19A, the depth "f" of contact hole 45 can be decreased since the booster electrode is not present between the word line and bit line, as shown in FIG. 19B.

Since the aspect ratio "f/e" ("e" indicating the dimension of opening of contact hole) of the bit line contact hole 45 can be reduced, the cell can be effectively miniaturized.

Figure 19A:
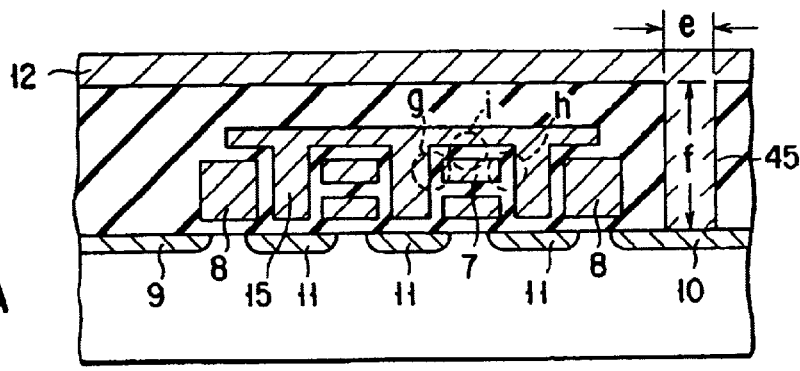
FIG. 19A is a cross-sectional view of the memory cell according to the first embodiment of the invention.

In the cell of the first embodiment, as shown in FIG. 19A, the word line 7 has three surfaces opposed to the booster electrode 15, i.e. side surfaces "g" and "h" and upper surface "i" of the word line 7.

Figure 19B:
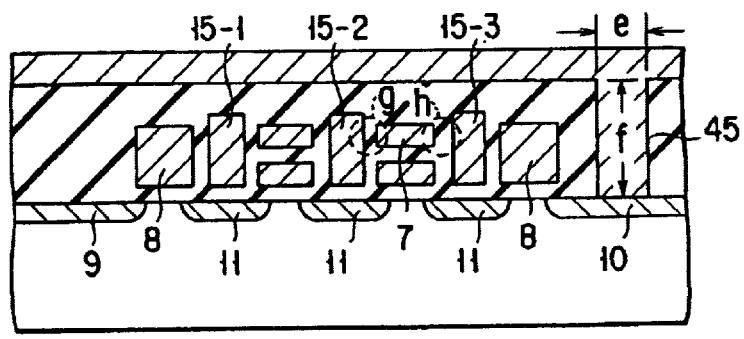
FIG. 19B is a cross-sectional view of the memory cell according to the second embodiment of the invention.

By contrast, in the cell of the second embodiment, as shown in FIG. 19B, only the side surfaces "g" and "h" of the word line 7 are opposed to the booster electrode. Thus, compared to the cell shown in FIG. 19A, a parasitic capacitance around the word line 7 can be reduced.

Since the parasitic capacitance of word line 7 is reduced, the rise time of word line 7 (i.e. time needed to charge the word line from 0V to a predetermined potential) and the fall time of word line 7 (i.e. time needed to discharge the word line from a predetermined potential to 0V) can be shortened.

Since these times can be shortened, the cell of the second embodiment can perform write, read and erase operations at higher speed.

According to the structure of the second embodiment, the first to third wiring-type booster electrodes BP1 to BP3 are independently formed. This structure can thus be modified so that the first to third wiring-type booster electrodes BP1 to BP3 may be independently controlled.

The method of fabricating the EEPROM of the second embodiment will now be described.

FIGS. 20 to 22 illustrate principal steps of fabricating the EEPROM according to the second embodiment. In FIGS. 20 to 22, each FIG. A is a plan view, each FIG. B is a cross-sectional view taken along line B—B in FIG. A, and each FIG. C is a cross-sectional view taken along line C—C in FIG. A.

According to the steps shown in FIGS. 8 to 14, the conductive polysilicon is deposited on the booster electrode insulation film 14 and the conductive film 42 which becomes booster electrodes is formed.

Figure 20A:
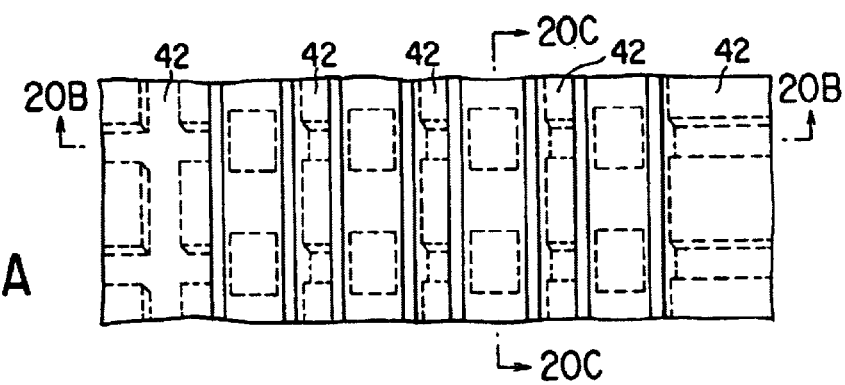
FIG. 20A is a plan view illustrating a manufacturing step of the memory cell according to the second embodiment of the invention.
Figure 20B:
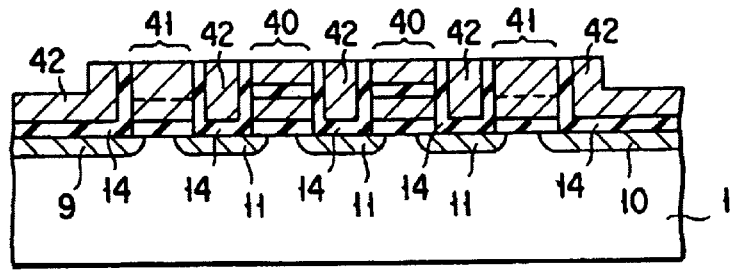
FIG. 20B is a cross-sectional view taken along line 20B—20B in FIG. 20A.
Figure 20C:
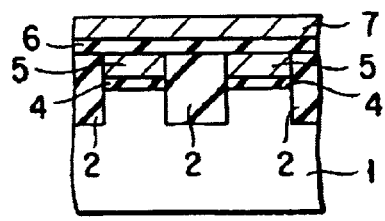
FIG. 20C is a cross-sectional view taken along line 20C—20C in FIG. 20A.

Subsequently, as shown in FIGS. 20A to 20C, the surface of the conductive film 42 is etched back by chemical mechanical polishing (CMP) or RIE. Thus, the conductive film 42 is buried only in trenches between the stacked-gate structure 40 and gate structure 41.

Figure 21A:
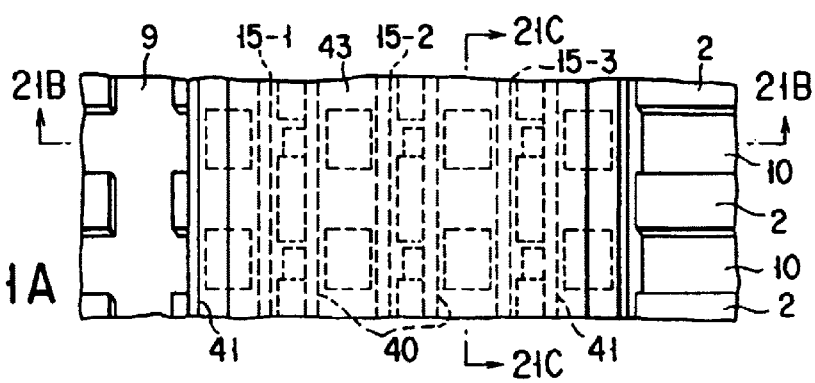
FIG. 21A is a plan view illustrating a manufacturing step of the memory cell according to the second embodiment of the invention.
Figure 21B:
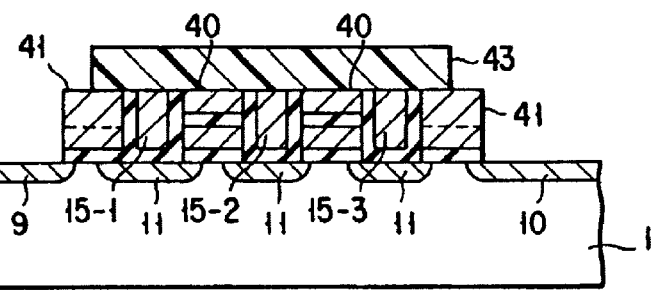
FIG. 21B is a cross-sectional view taken along line 21B—21B in FIG. 21A.
Figure 21C:
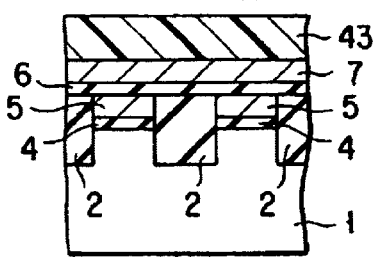
FIG. 21C is a cross-sectional view taken along line 21C—21C in FIG. 21A.

Then, as shown in FIGS. 21A to 21C, that portion of the buried conductive film 42, which lies on the diffusion layers 9, 10, are removed. Reference numeral 43 denotes a mask layer of a photoresist. Thereby, wiring-type booster electrodes 15-1 to 15-3 are formed over the diffusion layers 11 with the booster electrode insulating film 14 interposed.

Figure 22C:
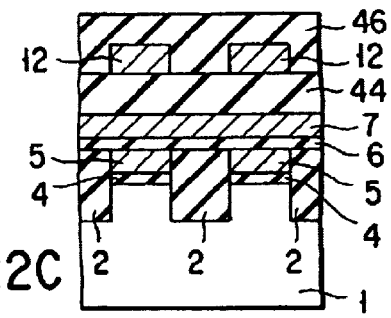
FIG. 22C is a cross-sectional view taken along line 22C—22C in FIG. 22A.
Figure 22A:
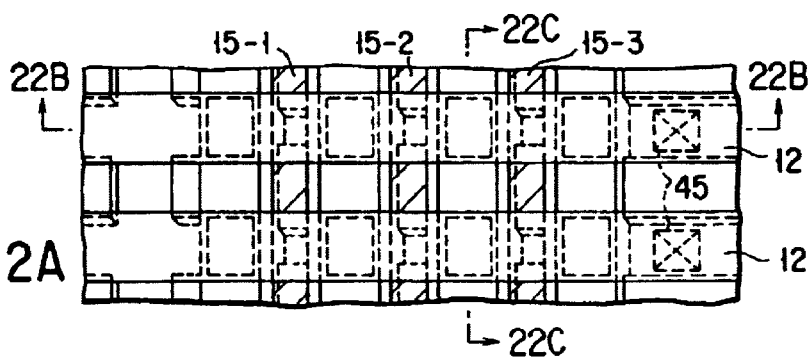
FIG. 22A is a plan view illustrating a manufacturing step of the memory cell according to the second embodiment of the invention.
Figure 22B:
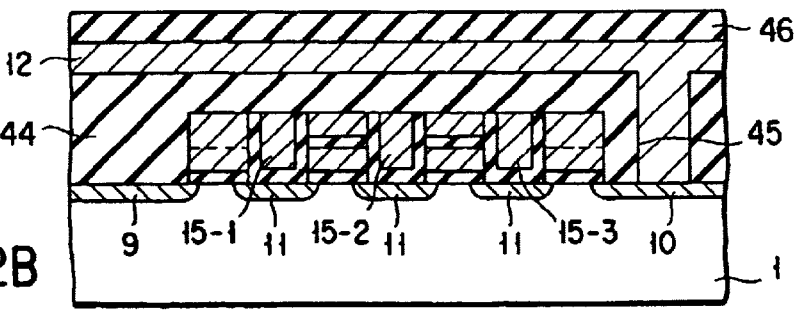
FIG. 22B is a cross-sectional view taken along line 22B—22B in FIG. 22A.

As is shown in FIGS. 22A to 22C, silicon dioxide is deposited on the structure shown in FIGS. 21A to 21C and a first interlayer insulation film 44 is formed. Then, a source line contact hole (not shown) communicating with the diffusion layer 9, a bit line contact hole 45 communicating with the diffusion layer 10, and a booster electrode control line contact hole (not shown) communicating with the booster electrode 15 are formed in the interlayer insulation film 44. Following this, a bit line, a source line (not shown) and a booster electrode control line (not shown) are formed.

At last, a second interlayer insulation film 46 is formed, and the fabrication of the EEPROM cell according to the second embodiment is completed.

An EEPROM cell according to a third embodiment of the invention will now be described.

Figure 23A:
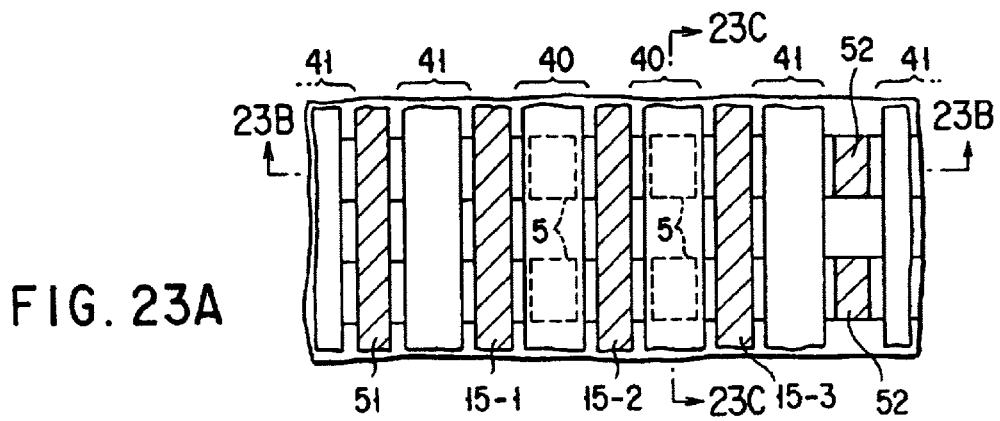
FIG. 23A is a plan view of a memory cell according to a third embodiment of the invention.
Figures 23B, 23C:
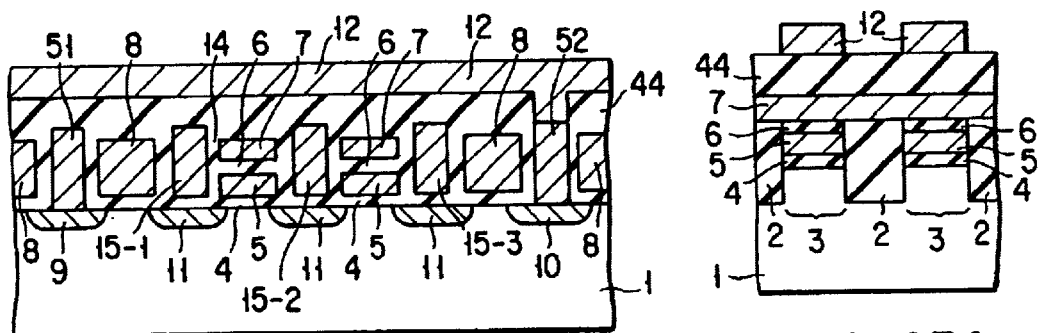
FIG. 23B is a cross-sectional view taken along line 23B—23B in FIG. 23A.
FIG. 23C is a cross-sectional view taken along line 23C—23C in FIG. 23A.

FIG. 23A is a plan view of the EEPROM cell according to the third embodiment, FIG. 23B is a cross-sectional view taken along line B—B in FIG. 23A and FIG. 23C is a cross-sectional view taken along line C—C in FIG. 23A. For the purpose of simple description, FIG. 23A does not show the bit line and the underlying interlayer insulation film.

As is shown in FIGS. 23A to 23C, in the third embodiment, like the second embodiment, booster electrodes 15 are buried between the stacked-gate structures 40 and between the stacked-gate structure 40 and gate structure 41. Thus, booster electrodes 15-1 to 15-3 having a wiring shape are formed in the cell array.

In addition, the conductive film forming the booster electrodes 15-1 to 15-3 is left on the source diffusion layer 9 and drain diffusion layer 10, and a source wiring 51 and a bit line contact plug 52 formed of the same conductor as the booster electrodes 15-1 to 15-3 are formed.

The source wiring 51 is formed in a wiring shape similarly with the booster electrodes 15-1 to 15-3 and is connected to the diffusion layer 9. In this case, the diffusion layer 9 may be formed in a line shape along the intervening region between the gate structures 41 or may be separated for each NAND cell.

The plug 52 is formed in an island shape and connected to the diffusion layer 10. In this case, the diffusion layer 9 is separated for each NAND cell connected to one bit line.

According to the third embodiment, like the second embodiment, the variance in coupling ratio γpgm can be reduced and a parasitic capacitance in the word line 7 can be decreased.

Figure 24A:
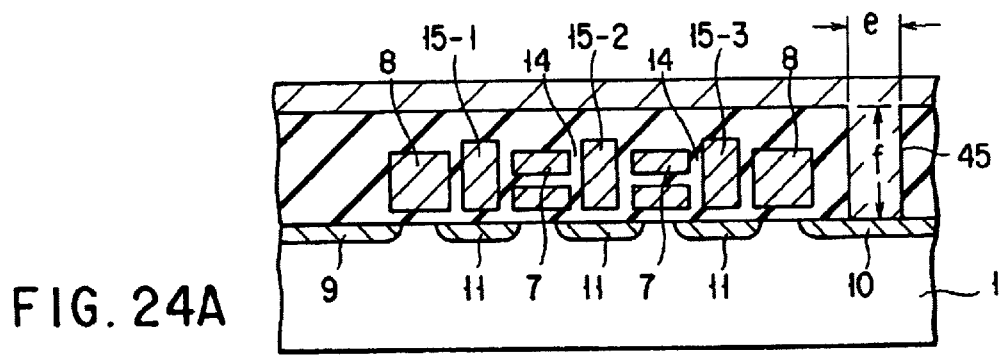
FIG. 24A is a cross-sectional view of the memory cell according to the second embodiment of the invention.
Figure 24B:
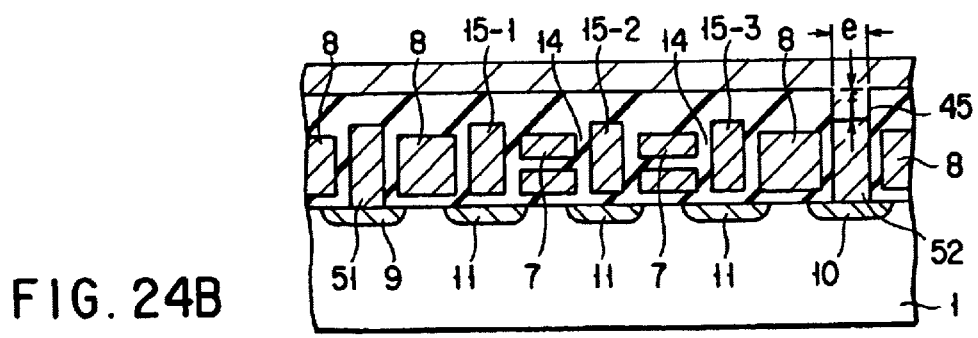
FIG. 24B is a cross-sectional view of the memory cell according to the third embodiment of the invention.

As is shown in FIG. 24B, the plug 52 is provided at a contact portion between the diffusion layer 10 and bit line 12. Accordingly, compared to the cell of the second embodiment shown in FIG. 24A, for example, the depth "f" of contact hole 45 can be further reduced. Therefore, the aspect ratio "f/e" of the bit line contact hole 45 can be further reduced and the cell can be effectively miniaturized.

A method of fabricating the EEPROM of the third embodiment will now be described.

FIGS. 25 to 30 illustrate in succession the principal steps of fabricating the EEPROM according to the third embodiment. In FIGS. 25 to 30, each FIG. A is a plan view, each FIG. B is a cross-sectional view taken along line B—B in FIG. A, and each FIG. C is a cross-sectional view taken along line C—C in FIG. A.

According to the steps shown in FIGS. 8 to 12, the stacked-gate structures 40 and gate structures 41 are formed and the N-type diffusion layers 9, 10 and 11 are formed.

Then, as shown in FIGS. 25A to 25C, a booster electrode insulating film 14 is formed and a first conductive film 53 is thinly deposited on the booster electrode insulating film 14. The first conductive film is formed of, e.g. conductive polysilicon.

In this manufacturing method, the pitch "i" between the gate structures 41, at which the N-type diffusion layer (source) 9 is formed, and the pitch "j" between the gate structures 41, at which the N-type diffusion layer (drain) 10 is formed, are made substantially equal to the pitch "g" between the gate structure 41 and stacked-gate structure 40, at which the N-type diffusion layer (source/drain of the cell) 11 is formed, and the pitch "h" between the stacked-gate structures 40, respectively.

The reason for this is that if the pitch "i" of the region for formation of the source wiring, the pitch "j" of the region for formation of the plug, and the pitches "g" and "h" of the regions for formation of booster electrodes are equalized, all trenches formed between the stacked-gate structures 40 and gate structures 41 can be easily filled with a conductor.

Since contact holes for contact with the substrate 1 are not formed in the regions with pitches "g" and "h", these pitches can be set at a minimum value. If the pitches "i" and "j" of the regions conventionally having contact holes are made to agree with the pitches "g" and "h", the degree of density of stacked-gate structures 40 and gate structures 41 is increased in the cell array section.

In addition, since the stacked-gate structures 40 and gate structures 41 are patterned to alternately appear at regular intervals, the pitches thus determined contributes to finer processing. Although it is desirable that the pitches "g", "h", "i" and "j" are equalized, the pitches "i" and "j" of the regions for formation of the source wiring and plug may be greater than the pitches "g" and "h" of the regions for formation of the booster electrodes, as in the first and second embodiments.

As is shown in FIG. 25A by reference symbol "k", the N-type diffusion layer 9, like the N-type diffusion layer 10, is isolated for each NAND cell connected to one bit line, i.e. for each column.

The reason for this is that in the third embodiment, even if the N-type diffusion layers 9 are isolated, these may be interconnected later by means of source wiring. If this patterning is adopted, the conventional mesh-like pattern of device regions 3 may be changed to a simple line-and-space pattern, and finer processing can be performed.

Although it is desirable that the N-type diffusion layer 9, like the N-type diffusion layer 10, be isolated for each column, the N-type diffusion layer 9 may be formed in one region along the intervening regions among the gate structures 40, as in the first and second embodiments.

Following the above steps, a mask layer 54 of a photoresist is formed on the conductive film 53, as shown in FIGS. 26A to 26C. Then, linear windows 55 and 56 corresponding to the intervening regions of the gate structures 41 are formed in the mask layer 54. Using the mask layer 54 as an etching mask, the booster electrode insulating film 14 is removed and the surfaces of the N-type diffusion layers 9 and 10 are exposed.

As is shown in FIGS. 27A to 27C, after the mask layer 54 is removed, a second conductive film 57 is deposited and filled in recesses between the stacked-gate structures 40 and gate structures 41. The second conductive film 57 is formed of, e.g. tungsten.

The first conductive film 53 and second conductive film 57 constitute a so-called "poly-metal structure film" 58. In this case, the second conductive film 57 is put in electrical contact with the N-type diffusion layers 9 and 10.

Subsequently, as shown in FIGS. 28A to 28C, the surface of the poly-metal structure film 58 is etched back by chemical mechanical polishing (CMP) or RIE. Thus, the poly-metal structure film 58 is buried only in trenches between the stacked-gate structure 40 and gate structure 41.

Figure 29A:
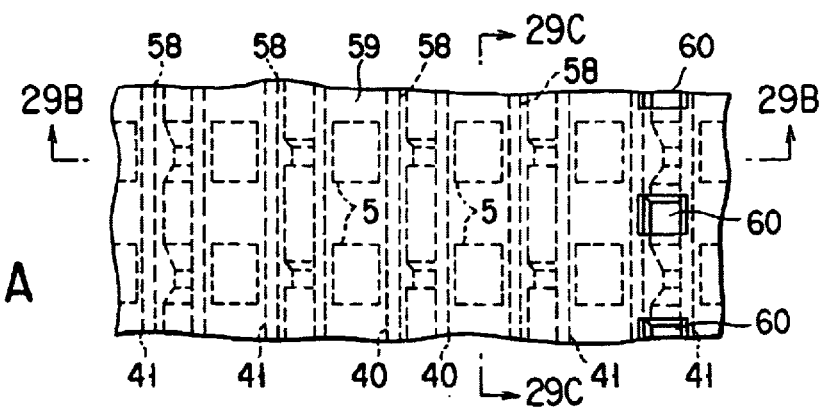
FIG. 29A is a plan view illustrating a manufacturing step of the memory cell according to the third embodiment of the invention.
Figure 29B:
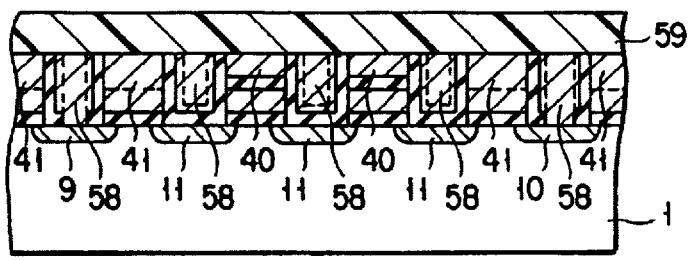
FIG. 29B is a cross-sectional view taken along line 29B—29B in FIG. 29A.
Figure 29C:
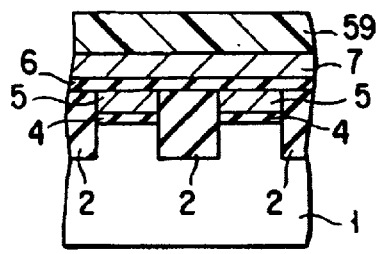
FIG. 29C is a cross-sectional view taken along line 29C—29C in FIG. 29A.

As is shown in FIGS. 29A to 29C, a mask layer 59 of a photoresist is formed on the structure shown in FIGS. 28A to 28C. Then, windows 60 corresponding to slit portions for isolating the poly-metal structure films 58 for respective N-type diffusion layers 10 are formed in the mask layer 59.

Using the mask layer 59 as an etching mask, the poly-metal structure film 58 is removed and isolated for each N-type diffusion layer 10. Thus, the poly-metal structure film 58 is formed into the source wiring 51, plug 52 and wiring-type booster electrodes 15-1 to 15-3.

Figure 30C:
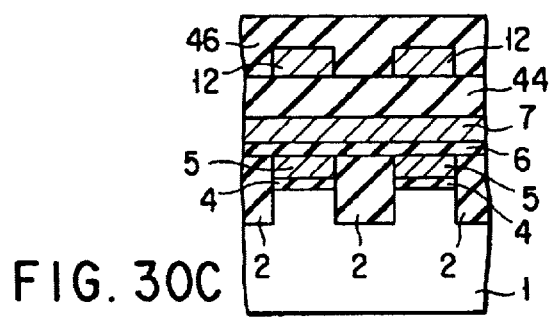
FIG. 30C is a cross-sectional view taken along line 30C—30C in FIG. 30A.
Figure 30A:
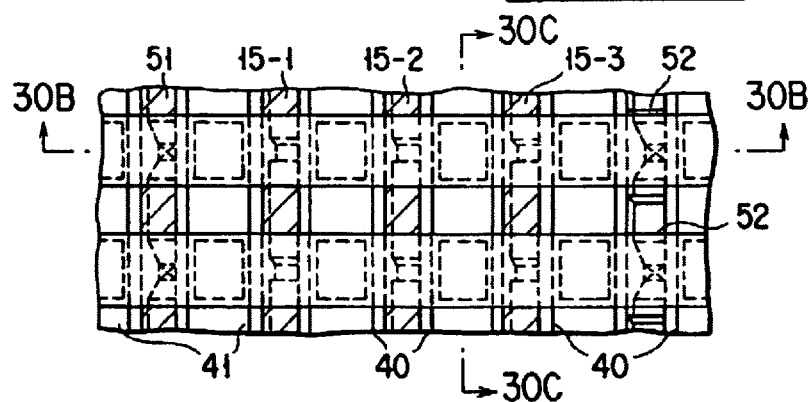
FIG. 30A is a plan view illustrating a manufacturing step of the memory cell according to the third embodiment of the invention.
Figure 30B:
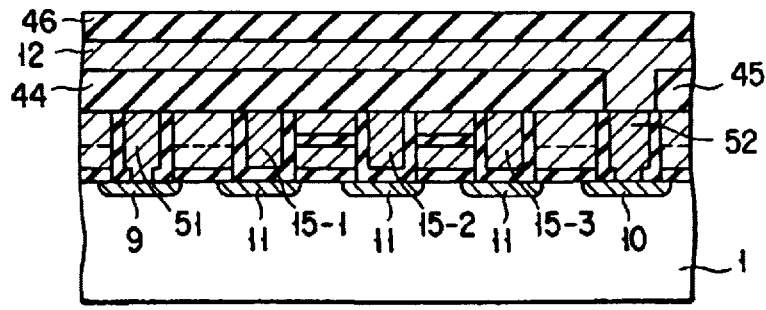
FIG. 30B is a cross-sectional view taken along line 30B—30B in FIG. 30A.

As is shown in FIGS. 30A to 30C, after the mask layer 59 is removed, a first interlayer insulation film 44 is formed, and a bit line contact hole 45 communicating with the plug 52, a source line contact hole (not shown) communicating with the source wiring 51 and a booster electrode control line contact hole (not shown) communicating with the wiring-type booster electrodes 15-1 to 15-3 are formed in the interlayer insulation film 44. Following this, a bit line BL, a source line (not shown) and a booster electrode control line (not shown) are formed.

At last, a second interlayer insulation film 46 is formed, and the fabrication of the EEPROM cell according to the third embodiment is completed.

An EEPROM cell according to a fourth embodiment of the invention will now be described.

Figure 31A:
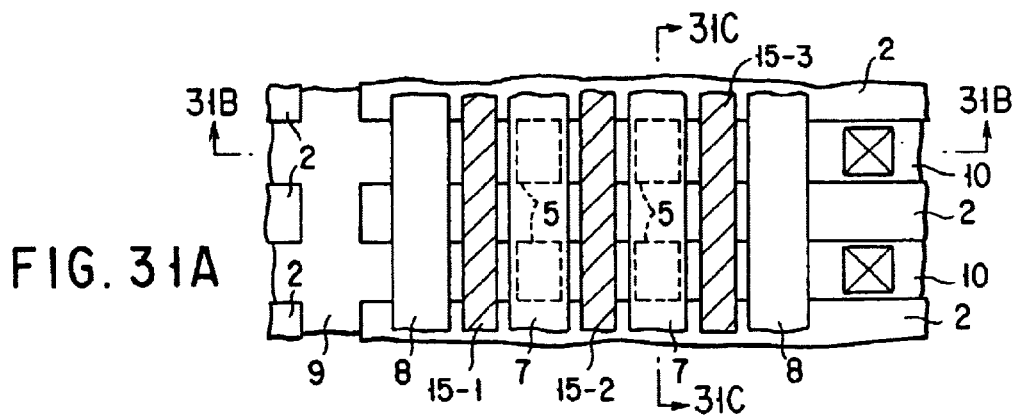
FIG. 31A is a plan view of a memory cell according to a fourth embodiment of the invention.
Figure 31B:
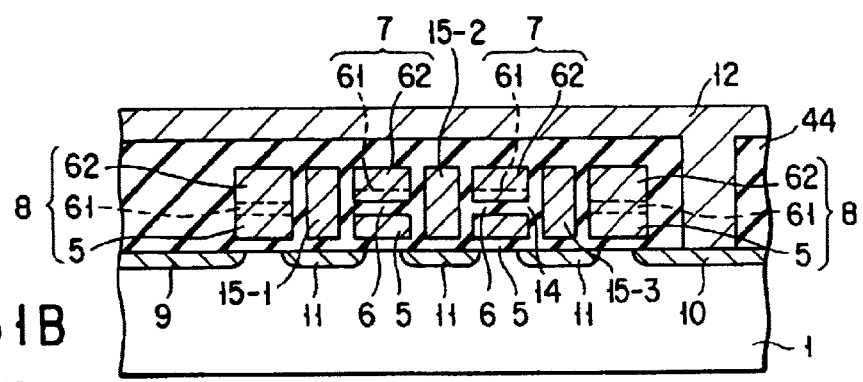
FIG. 31B is a cross-sectional view taken along line 31B—31B in FIG. 31A.
Figure 31C:
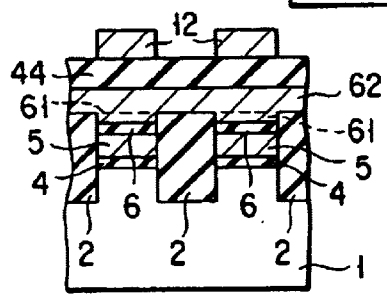
FIG. 31C is a cross-sectional view taken along line 31C—31C in FIG. 31A.

FIG. 31A is a plan view of the EEPROM cell according to the fourth embodiment, FIG. 31B is a cross-sectional view taken along line 31B—31B in FIG. 31A and FIG. 31C is a cross-sectional view taken along line 31C—31C in FIG. 31A. For the purpose of simple description, FIG. 31A does not show the bit line and the underlying interlayer insulation film.

As is shown in FIGS. 31A to 31C, in the fourth embodiment, the word line 7 has a stacked-structure comprising a first conductive film 61 and a second conductive film 62 formed on the first conductive film 61, and the first conductive film 61 is not provided on the device isolation insulation layer 2.

FIGS. 31A to 31C show the fourth embodiment as having the structure including wiring-type booster electrodes 15-1 to 15-3, like the second embodiment. However, needless to say, the structure of the fourth embodiment can be applied to the cell of the first embodiment with the booster electrode 15 covering the stacked-gate structure 41 or to the cell of the third embodiment with the source wiring 51 and plug 52 formed of the same conductor as the wiring-type booster electrodes 15-1 to 15-3.

A method of fabricating the EEPROM cell of the fourth embodiment will now be described.

Figure 32C:
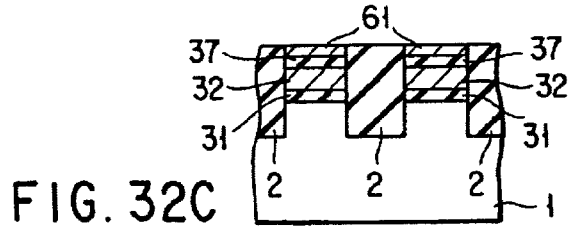
FIG. 32C is a cross-sectional view taken along line 32C—32C in FIG. 32A.
Figure 32A:
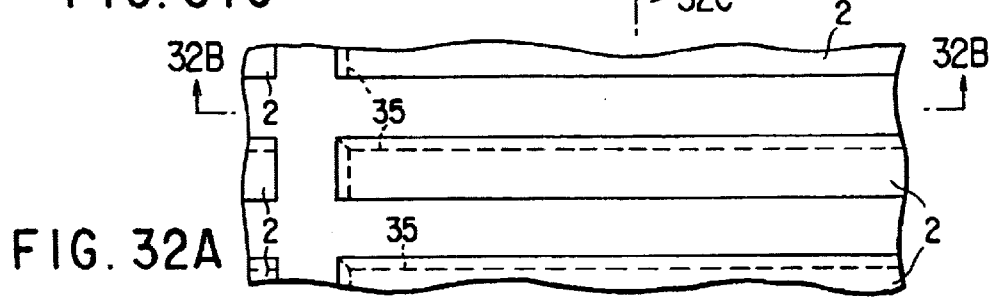
FIG. 32A is a plan view illustrating a manufacturing step of the memory cell according to the fourth embodiment of the invention.
Figure 32B:
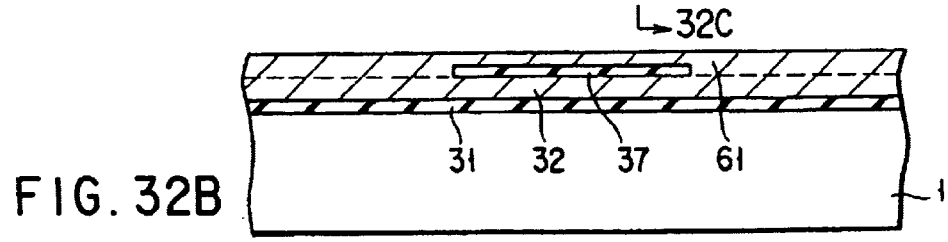
FIG. 32B is a cross-sectional view taken along line 32B—32B in FIG. 32A.

FIGS. 32A to 32C illustrate in succession the principal steps of fabricating the EEPROM according to the fourth embodiment. FIG. 32A is a plan view, FIG. 32B is a cross-sectional view taken along line 32B—32B in FIG. 32A, and FIG. 32C is a cross-sectional view taken along line 32C—32C in FIG. 32A.

According to the method illustrated in FIGS. 8A to 8C, the silicon dioxide film 31 which becomes the tunnel insulation film and the conductive polysilicon layer 32 which becomes the floating gate are formed on the P-type silicon substrate 1.

The ONO film 37 which becomes the insulation film is formed on the conductive polysilicon layer 32. That portion of the ONO film 37, which corresponds to the region of the select transistor, is removed.

As is shown in FIGS. 32A to 32C, the first conductive film 61 is formed, thereby forming a first stacked-film structure comprising the silicon dioxide film 31, conductive polysilicon layer 32, ONO film 37 and first conductive film 61.

The first conductive film is formed of a conductive polysilicon. Then, a silicon nitride film (not shown), which serves as an etching mask in forming the device isolation trench, is formed and the silicon nitride film (not shown) is patterned in accordance with the device region.

Subsequently, using the silicon nitride film (not shown) as a mask, the substrate 1 is etched and the device region 3 and device isolation trench 35 which are self-aligned with the remaining portion of the first stacked-film structure are formed on the substrate 1.

The trench 35 is then filled with the silicon dioxide film. The silicon dioxide film is subjected to chemical mechanical polishing (CMP), and the silicon nitride film is buried in the trench 35 and the device isolation region 2 is formed. Then, the silicon nitride film 33, if it is left, is removed.

Although not shown in particular, a second conductive film 62 is formed on the structure shown in FIGS. 32A to 32C, and a stacked structure of the first conductive film 61 and second conductive film 62 is obtained. The second conductive film is formed of tungsten.

Subsequently, for example, according to the manufacturing method illustrated in FIGS. 10 to 14, the stacked-gate structure 40 and gate structure 41 are formed, the N-type diffusion layers 9, 10 and 11 are formed and the booster electrode insulation film 14 is formed.

The conductor which becomes the booster electrode is then formed. Following this, according to the manufacturing method described with reference to FIG. 15, FIGS. 20 and 21, or FIGS. 25 to 29, the booster electrode 15 or wiring-type booster electrodes 15-1 to 15-3, and the source wiring 51 and plug 52 are formed.

As has been described with reference to FIG. 16, 22 or 30, the first interlayer insulation film is then formed. The bit line contact hole, etc. are formed in the first interlayer insulation film, and the bit line, etc. are formed on the first interlayer insulation film. Thereafter, the second interlayer insulation film is formed, and the fabrication of the cell according to the fourth embodiment is completed.

According to the fourth embodiment of the invention, like the first embodiment, the variance in the coupling ratio γpgm can be reduced. In addition, the word line 7 has the stacked structure comprising the first conductive film 61 and second conductive film 62, and the resistance thereof is decreased. Therefore, the cell of the fourth embodiment can perform write, read and erase operations at higher speed.

Although tungsten is used as material of the second conductive film 62, other high-melting point metals or silicides thereof may be used.

An EEPROM cell according to a fifth embodiment of the invention will now be described.

Figure 33A:
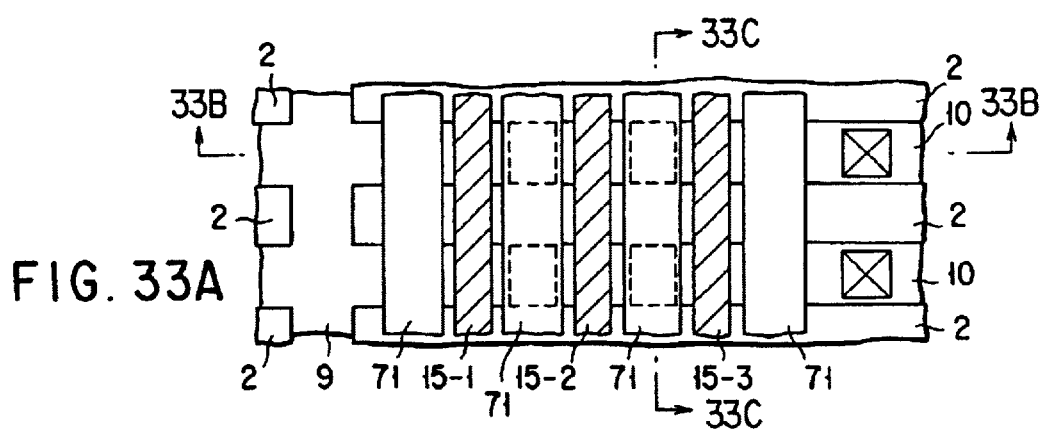
FIG. 33A is a plan view of a memory cell according to a fifth embodiment of the invention.
Figures 33B, 33C:
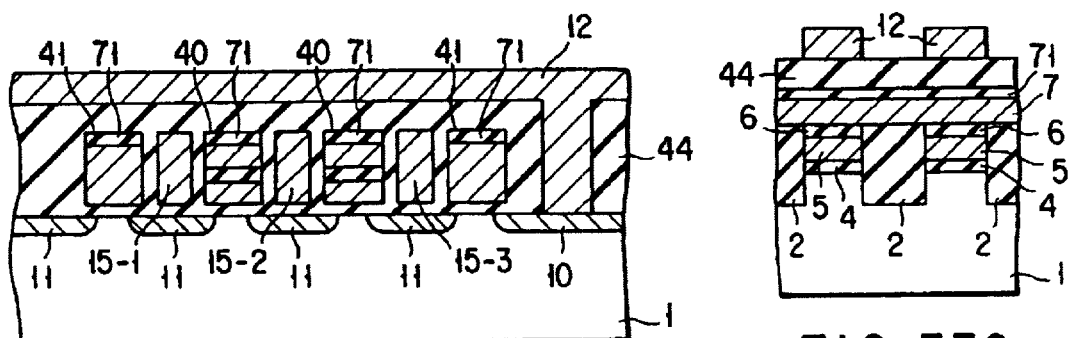
FIG. 33B is a cross-sectional view taken along line 33B—33B in FIG. 33A.
FIG. 33C is a cross-sectional view taken along line 33C—33C in FIG. 33A.

FIG. 33A is a plan view of the EEPROM cell according to the fifth embodiment, FIG. 33B is a cross-sectional view taken along line 33B—33B in FIG. 33A and FIG. 33C is a cross-sectional view taken along line 33C—33C in FIG. 33A. For the purpose of simple description, FIG. 33A does not show the bit line and the underlying interlayer insulation film.

As is shown in FIGS. 33A to 33C, in the fifth embodiment, cap layers 71 of insulating material are provided on the stacked-gate structure 40 and gate structure 41.

FIGS. 33A to 33C show the fifth embodiment as having the structure including wiring-type booster electrodes 15-1 to 15-3, like the second embodiment. However, needless to say, the structure of the fifth embodiment can be applied to the cell of the first embodiment with the booster electrode 15 covering the stacked-gate structure 41 or to the cell of the third embodiment with the source wiring 51 and plug 52 formed of the same conductor as the wiring-type booster electrodes 15-1 to 15-3.

The technique of the fifth embodiment can also be applied to the fourth embodiment wherein the word line 7 has the stacked structure.

A method of fabricating the EEPROM cell of the fifth embodiment will now be described.

Figure 34A:
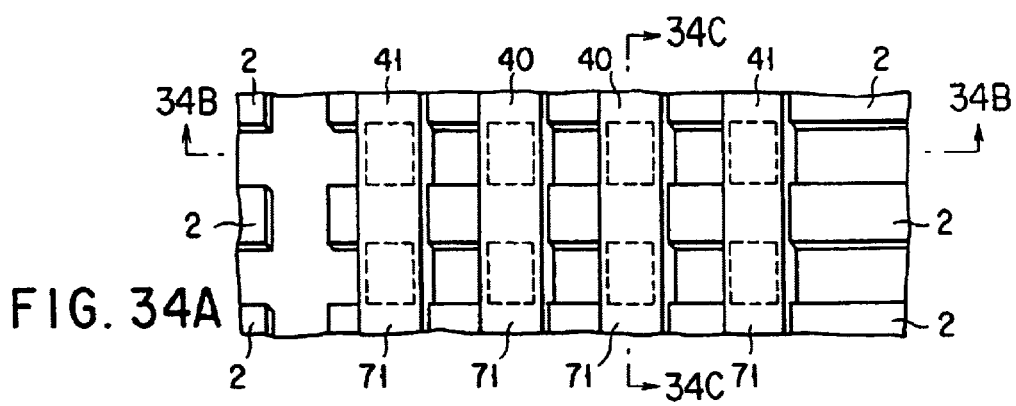
FIG. 34A is a plan view illustrating a manufacturing step of the memory cell according to the fifth embodiment of the invention.
Figures 34B, 34C:
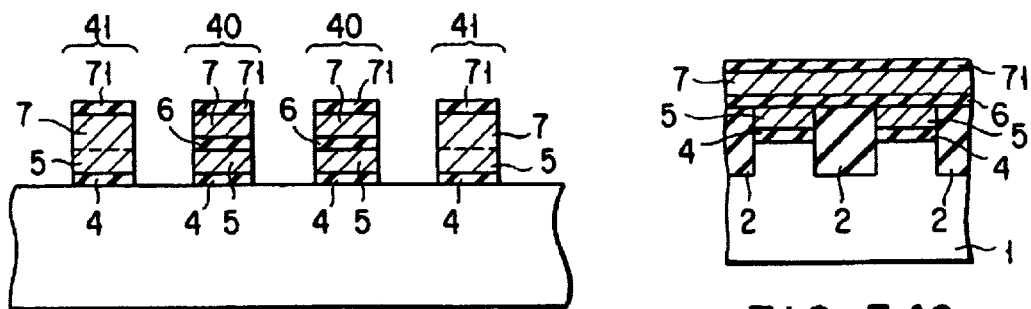
FIG. 34B is a cross-sectional view taken along line 34B—34B in FIG. 34A.
FIG. 34C is a cross-sectional view taken along line 34C—34C in FIG. 34A.

FIGS. 34A to 34C illustrate the principal steps of fabricating the EEPROM according to the fifth embodiment. FIG. 34A is a plan view, FIG. 34B is a cross-sectional view taken along line 34B—34B in FIG. 34A, and FIG. 34C is a cross-sectional view taken along line 34C—34C in FIG. 34A.

According to the method illustrated in FIGS. 8 to 10, the first stacked-film structure including the silicon dioxide film which becomes the tunnel insulation film, the conductive polysilicon layer which becomes the floating gate, and the silicon nitride film is formed on the P-type silicon substrate 1.

Subsequently, the first stacked-film structure and substrate are etched, and the device region and device isolation trench which are self-aligned with the remaining portion of the first stacked-film structure are formed on the substrate, and the device isolation region 2 is formed.

Cap layers 71 of insulating material are formed on the structure shown in FIGS. 10A to 10C. The cap layers 71 are formed of, e.g. silicon nitride.

As is shown in FIGS. 34A and 34B, the stacked-gate structure 40 and gate structure 41 are formed according to the method described with reference to FIGS. 11A to 11C. The upper surfaces of the stacked-gate structure 40 and gate structure 41 are covered with the cap layers 71.

Although not shown in particular, according to the manufacturing method illustrated in FIGS. 12 to 14, the N-type diffusion layers 9, 10 and 11 are formed and the booster electrode insulation film 14 is formed. A conductor material which becomes the booster electrode is deposited.

Following this, according to the manufacturing method described with reference to FIG. 15, FIGS. 20 and 21, or FIGS. 25 to 29, the booster electrode 15 or wiring-type booster electrodes 15-1 to 15-3, and the source wiring 51 and plug 52 are formed.

In particular, the cap layers 71 function as stoppers for polishing/etching-back in the method illustrated in FIGS. 20–21 or 25–29 wherein the material of the booster electrode is subjected to chemical mechanical polishing or etched back and buried between the stacked-gate structures 40, between the stacked-gate structure 40 and gate structure 41 and between the gate structures 41. Therefore, a decrease in film thickness of the word line 7 can be prevented.

As has been described with reference to FIG. 16, 22 or 30, the first interlayer insulation film is then formed. The bit line contact hole, etc. are formed in the first interlayer insulation film, and the bit line, etc. are formed on the first interlayer insulation film. Thereafter, the second interlayer insulation film is formed, and the fabrication of the cell according to the fifth embodiment is completed.

According to the fifth embodiment of the invention, like the first to fourth embodiments, the variance in the coupling ratio γpgm can be reduced.

In the above embodiments, the P-type semiconductor substrate is used as BULK. However, needless to say, the P-type well in an N-type semiconductor substrate may be used as BULK and the cell may be formed on the BULK. Other modifications may be made without departing from the spirit of the invention.

As has been described above, the present invention can provide a non-volatile semiconductor memory device and a method of manufacturing the same, wherein a variation in potential VFG due to a variation in coupling ratio γpgm can be suppressed, and defects such as erroneous write, in which electrons are erroneously injected in a floating gate of a non selected cell in which a gate is to be the word line at the time of the write or a cell designated for "1" write, or read disturb can be prevented.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a non-volatile semiconductor memory device, comprising the steps of:

forming a first film on a semiconductor substrate of a first conductivity type, the first film including at least a first conductive film and a first insulating film for insulation between the first conductive film and the substrate;

removing an area of the first film, which corresponds to a device isolation region, and forming a device region and a device isolation trench on the substrate in a self-alignment manner with a remaining portion of the first film;

filling an insulation material in the device isolation trench;

forming a second film on the first film and the insulation material, the second film including at least a second conductive film capacitively coupled to a portion of the substrate which corresponds to the device region, with the first conductive film interposed;

removing portions of the first film and the second film, which correspond to semiconductor active regions of a second conductivity type to be formed on the device region, thus forming stacked gates each including a floating gate formed of the first conductive film and self-aligned with the device region and a word line formed of the second conductive film and capacitively coupled to the floating gate;

forming the semiconductor active regions in the substrate in a self-alignment manner with the stacked gates and the insulation material; and forming a booster electrode capacitively coupled, with an insulation layer interposed, to the floating gate, the word line and the semiconductor active regions in regions functioning as a source and a drain of a memory cell.

2. The method according to claim 1, wherein the booster electrode is buried in each of recesses formed between stacked gates.

3. The method according to claim 1, wherein the second conductive film is electrically connected to the first conductive film in regions where select transistors are formed and electrically insulated from the first conductive film in regions where memory cells are formed.

4. The method according to claim 3, wherein the step of forming the stacked gates comprises a step of forming select gate lines in which the first conductive film and the second conductive film are electrically connected.

5. The method according to claim 4, wherein the booster electrode is formed by filling a conductive material in recesses between adjacent two of the select gate lines, recesses between the select gate line and the stacked gate and recesses between adjacent two of the stacked gates, and then removing the conductive material from the recesses between adjacent two of the select gate lines.

6. The method according to claim 1, wherein the semiconductor active regions of the second conductivity type comprise first regions functioning as the source and the drain of the memory cell, a second region connected to a source wiring and a third region connected to a bit line, and the step of forming the booster electrode comprises a step of forming the source wiring of the same conductive material as the booster electrode electrically connected to the second region and a bit line contact plug of the same conductive material as the booster electrode electrically connected to the third region.

7. The method according to claim 1, wherein the word line comprises:

a first conductive layer formed above the floating gate; and a second conductive layer formed on the first conductive layer and the device isolation region.

8. The method according to claim 1, further comprising an insulation layer formed on the word line.

* * * * *